United States Patent [19]

Whetsel

[11] Patent Number: 5,706,296
[45] Date of Patent: Jan. 6, 1998

[54] BI-DIRECTIONAL SCAN DESIGN WITH MEMORY AND LATCHING CIRCUITRY

[75] Inventor: Lee D. Whetsel, Plano, Tex.

[73] Assignee: Texas Instruments Incorporated, Dallas, Tex.

[21] Appl. No.: 395,543

[22] Filed: Feb. 28, 1995

[51] Int. Cl.⁶ ................................................ G01R 31/28
[52] U.S. Cl. ........................................................ 371/22.3
[58] Field of Search .............................. 371/22.1, 22.3, 371/22.5, 22.6, 15.1; 324/73.1, 158.1; 365/201

[56] References Cited

U.S. PATENT DOCUMENTS

| | | | |
|---|---|---|---|
| 5,084,874 | 1/1992 | Whetsel, Jr. | 371/22.3 |
| 5,134,314 | 7/1992 | Wehrmacher | 307/443 |
| 5,206,545 | 4/1993 | Huang | 307/443 |
| 5,373,514 | 12/1994 | Ma | 371/57.1 |
| 5,420,871 | 5/1995 | Maamari et al. | 371/29.5 |
| 5,450,415 | 9/1995 | Kamada | 371/22.3 |
| 5,490,151 | 2/1996 | Feger et al. | 371/22.3 |
| 5,497,378 | 3/1996 | Amini et al. | 371/22.3 |
| 5,568,492 | 10/1996 | Flint et al. | 371/22.1 |

FOREIGN PATENT DOCUMENTS

| | | | |
|---|---|---|---|
| 2 220 272 A | 1/1990 | European Pat. Off. | G01R 31/28 |
| 0 518 550 A2 | 12/1992 | European Pat. Off. | G06F 11/26 |
| 0 522 413 A2 | 1/1993 | European Pat. Off. | G06F 11/26 |
| 2 266 965 A | 11/1993 | European Pat. Off. | G01R 31/28 |
| 0 604 032 A2 | 6/1994 | European Pat. Off. | G06F 11/26 |

OTHER PUBLICATIONS

Maunder et al., "The Test Access Port and Boundary Scan Architecture" IEEE Computer Society Press, pp. 159–170, Dec. 1992.

Dilip K. Bhavsar, "Chapter 17. Cell Designs that Help Test Interconnect Shorts", IEEE 1990, pp. 183–189.

Bulent Dervisoglu, "IEEE P1149.2 Description and Status Report", IEEE, Sep. 1992, pp. 79–81.

L. Whetsel, "IEEE STD. 1149.1–An Introduction", NEPCON, Feb. 1993, 10 pages.

Unapproved Draft IEEE P1149.2–D2.5, "Extended Digital Serial Subset", IEEE, Aug. 1994, pp. 1–37.

Nai–Chi Lee, "A Hierarchical Analog Test Bus Framework for Testing Mixed–Signal Integrated Circuits and Printed Circuit Boards", Journal of Electronic Testing, vol. 4, No. 4, Nov. 1, 1993, pp. 361–368.

David George, "Use a reprogrammable Approach to Boundary Scan for FPGS's", EDN Electrical Design News, vol. 38, No. 16, 5 Aug. 1993, pp. 97–100.

Primary Examiner—Robert W. Beausoliel, Jr.
Assistant Examiner—Stephen C. Elmore
Attorney, Agent, or Firm—Scott B. Stahl; Leo N. Heiting; Richard L. Donaldson

[57] ABSTRACT

A scan cell (51) for use at an input/output terminal includes memory circuitry (Mem 1) for storing test data from a test data path, and a latching circuit (S4, LOB; S6, LIB) connected to the memory circuitry for receiving and selectively latching the test data stored in the memory circuitry. The input/output terminal has an input buffer (IB) and an output buffer (3SOB) associated therewith, and the latching circuit includes one of the input buffer and the output buffer.

19 Claims, 19 Drawing Sheets

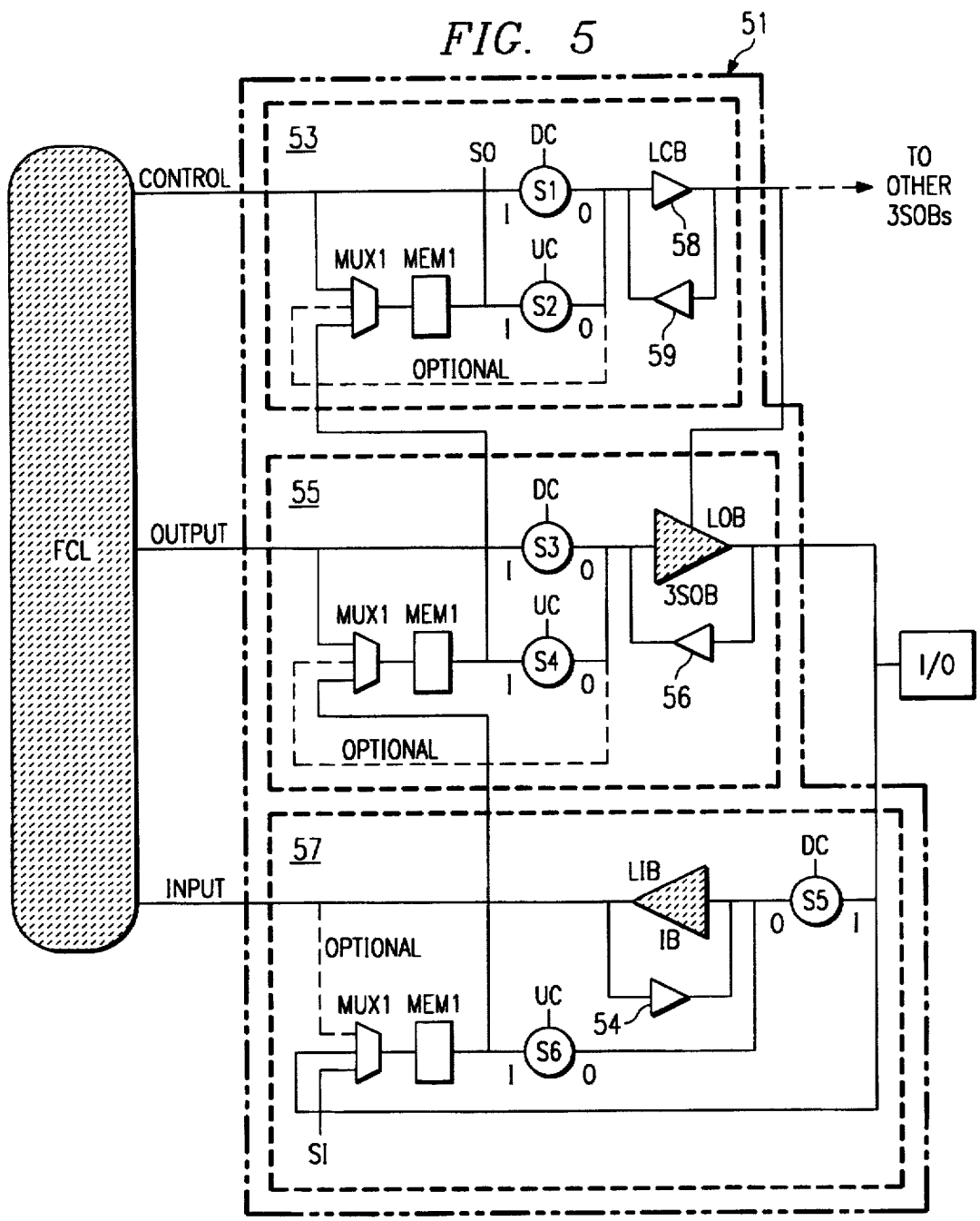
FIG. 5
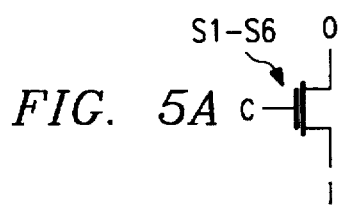
FIG. 5A  TRANSMISSION GATE
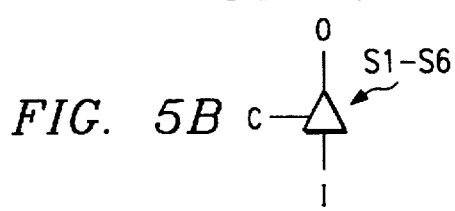
FIG. 5B  3-STATE BUFFER

TRANSMISSION GATE

3-STATE BUFFER

WEAK BUFFER

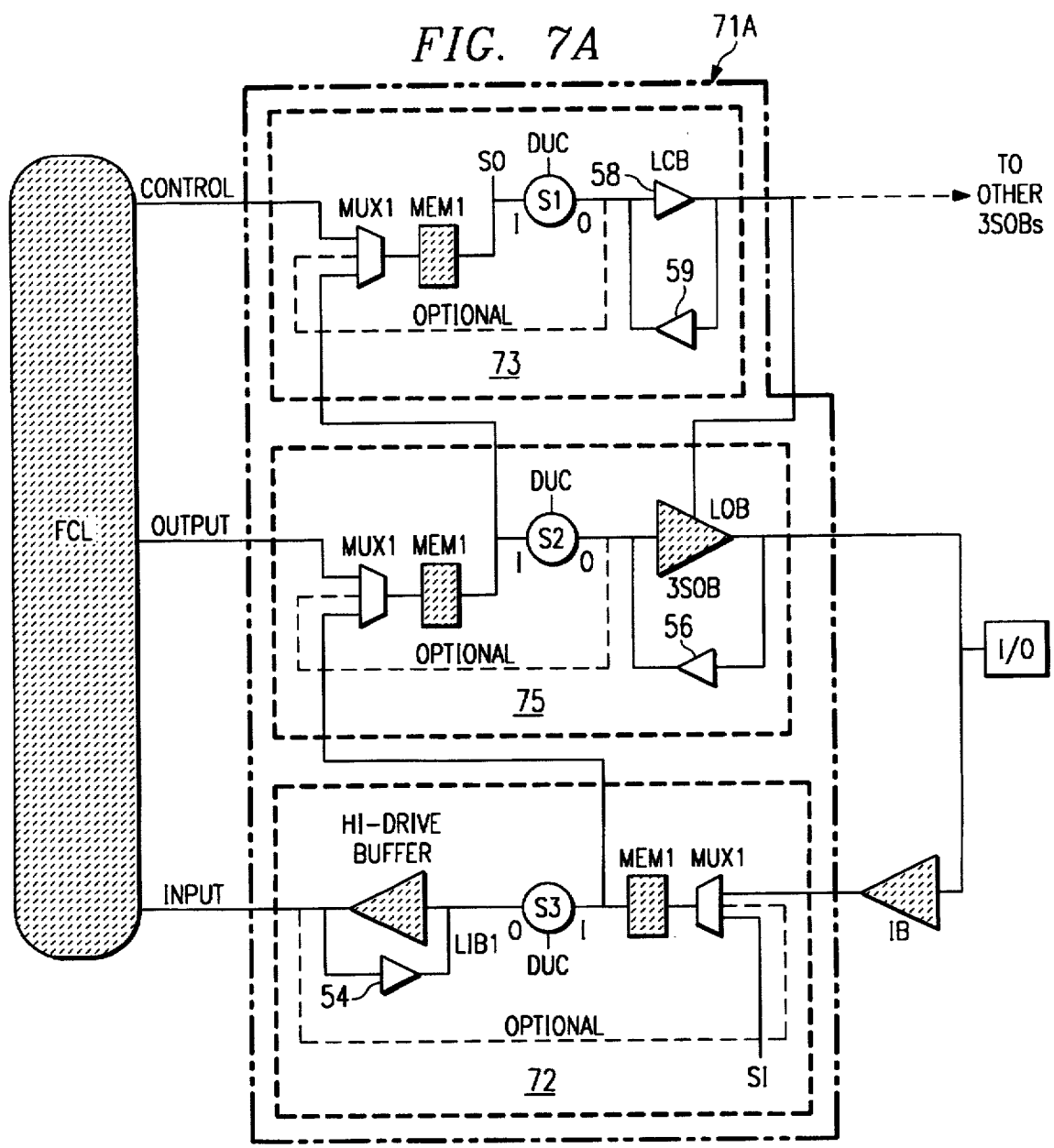

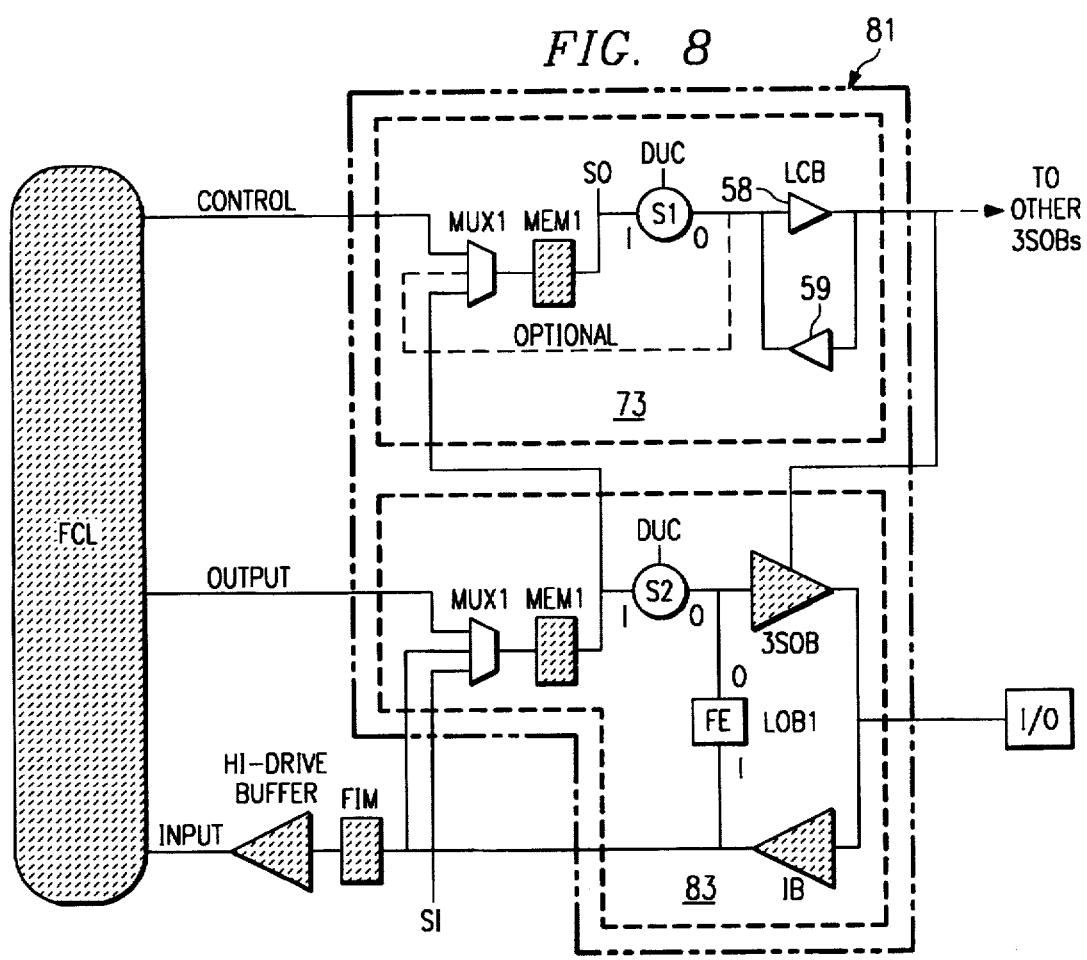

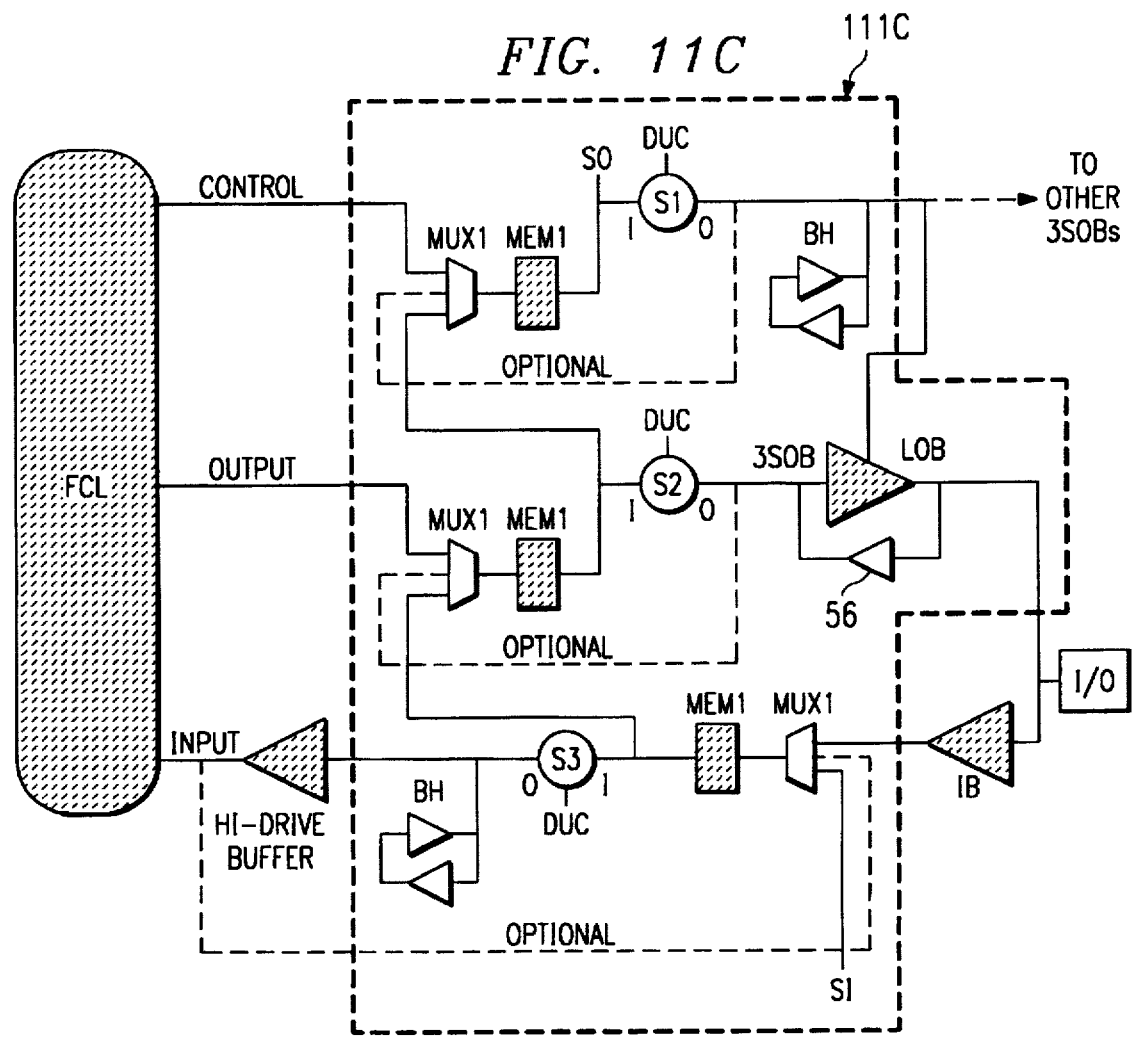

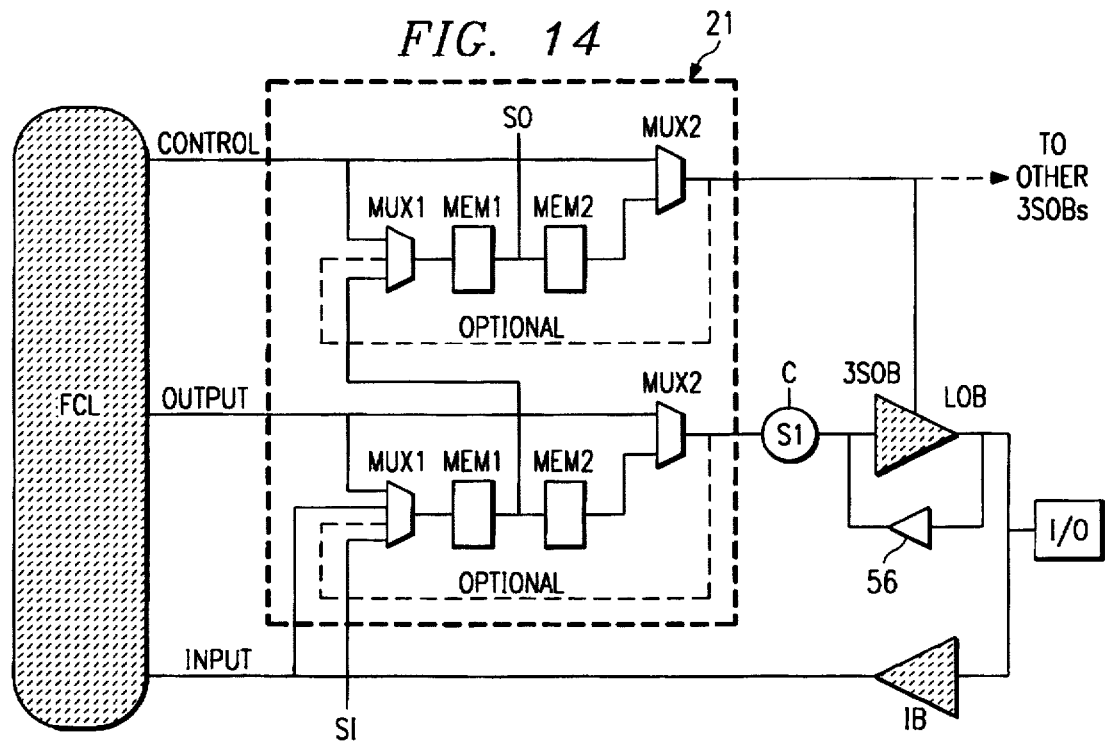
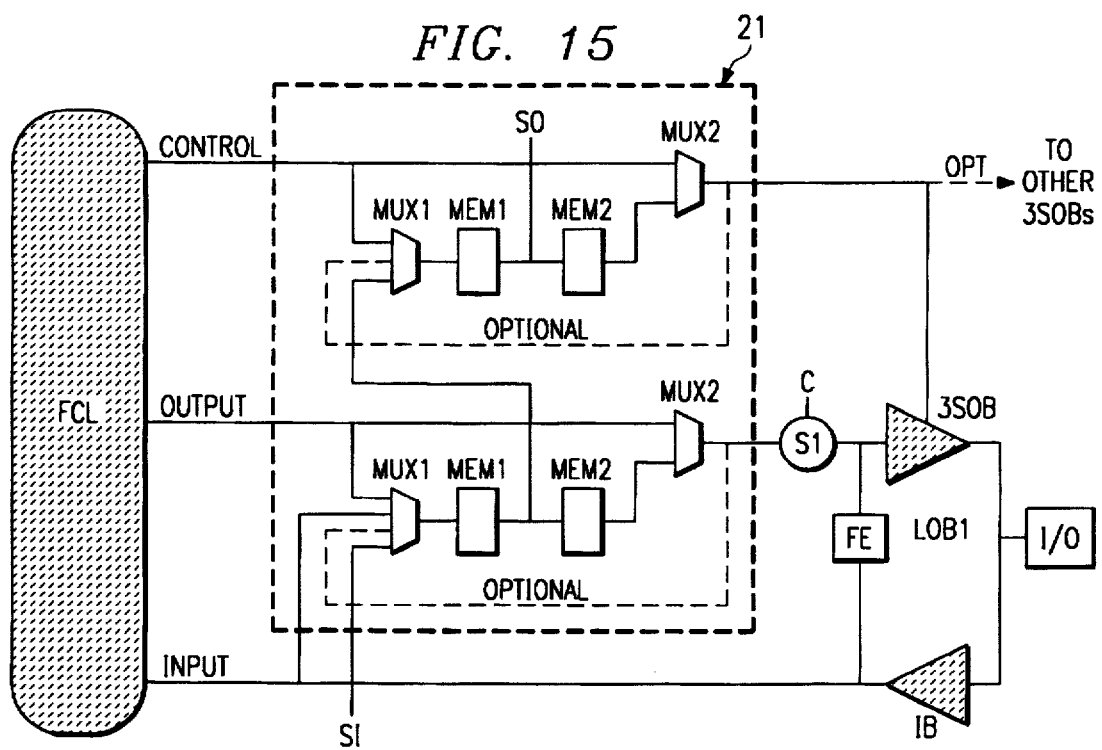

BI-DIRECTIONAL SCAN DESIGN WITH MEMORY AND LATCHING CIRCUITRY

TECHNICAL FIELD OF THE INVENTION

This invention relates generally to scan cells for testing integrated circuits and, more particularly, to bi-directional scan cells and scan cell output latches.

BACKGROUND OF THE INVENTION

Today boundary scan design in integrated circuits (ICs) is based on an IEEE standard referred to as 1149.1. In the future, boundary scan may be based on alternate IEEE boundary scan standards such as the currently developing P1149.2 standard. In boundary scan, flip flops and/or latches, referred to from this point forward as memories, and multiplexers form boundary scan cells at the IC input, output and bi-directional pins. The cells are serially connected and can be accessed by a test access port on the IC to provide controllability and observability of each IC pin type. Using the boundary scan structure within the IC, wiring interconnects and/or external circuitry located between ICs on a board or multichip module can be easily tested for assembly related faults such as shorts and opens. Boundary scan is well known in the electronics test industry.

In FIG. 1, an example 1149.1 bi-directional scan cell (BSC) is shown residing between an ICs functional core logic (FCL) and an input/output (I/O) pin. In this and all following Figures the IC functional circuitry areas are shown shaded to differentiate them from the IC test circuitry areas. The BSC 11 comprises three individual unidirectional scan cells (USC) 13, 15 and 17. One USC 13 resides in the 3-state control path between the FCL and the 3-state output buffer (3SOB), another USC 15 resides in the data output path between the FCL and 3SOB, and the other USC 17 resides in the data input path between the FCL and the input buffer IB. Each USC comprises dedicated test circuitry to implement multiplexers Mux1 and Mux2, and memories Mem1 and Mem2. Mux1 and Mem1 form the input section of each USC and are used to capture IC data (control in USC 13, output in USC 15, input in USC 17) and shift data through the serially connected USCs from their serial input (SI) to their serial output (SO). Mux2 and Mem2 form the output section of each USC and are used to output either IC data (control, output, input) or test data stored in Mem2.

In normal IC operation, IC data (control, output, input from FCL) is output from Mux2. During test operation, test data stored in Mem2 is output from Mux2. In normal IC operation, the input section of the USCs can be operated to capture IC data (control, output, input from FCL) and shift this data through Mem1 while Mux2 outputs this data. In test operation, the input section of the USCs can be operated to capture IC data (from FCL) and shift this data through Mem1 while Mux2 outputs test data from Mem2. The data resident in Mem1 after the shifting process is completed is updated into Mem2. Thus in test operation, the data output from Mux2 only changes at the end of the shifting process. The combination of the three USCs in FIG. 1 provide the 1149.1 test circuitry for BSCs located at bi-directional IC pins. The structure and operation of this 1149.1 BSC test circuitry is well known in the art.

In a bussed arrangement of I/O pins (for example, a bi-directional data bus), one control USC 13 can be used to enable or disable all bussed 3SOBs (as indicated by the dotted line from Mux2 of the control USC 13). Note that Mux2 of input USC 17 inhibits the input buffer from driving the FCL directly, and therefore the addition of a hi-drive buffer is typically required on the input path between the USC 17 and FCL as shown in FIG. 1. Including the hi-drive buffer adds test circuitry overhead to each I/O pin and delays the input signal from the I/O pin.

The full featured BSC of FIG. 1 is a required implementation on all pins of user programmable technologies that implement the 1149.1 test standard. Programmable technologies such as fuse programmable gate arrays, Ram programmable gate arrays, programmable crossbar switches, PALS, and ASIC gate arrays must anticipate the user programming each pin to be any one of an input, a 2-state output, a 3-state output, or an I/O pin type. Furthermore, in these programmable technologies, each pin requires its own control USC to allow individual 3-state control of each pin (i.e. one control USC cannot be used to control a bussed arrangement of I/O pins, as previously mentioned, since the pins must be completely programmable by the user). Unlike custom technologies, where IC pins can be optimized to contain only test circuitry for use with an input, output, or I/O pin, programmable technologies must include full I/O test circuitry on each pin so that the user can program the pins as required. This causes programmable technologies to have excess test circuitry on pins that are not programmed to be full I/O types. For example, if the IC of FIG. 1 was a programmable type and the pin was specified to be an input, not an I/O as shown, the control USC 13, the output USC 15, and the 3SOB would be unused circuitry. If the pin were programmed to be a 2-state output, the control USC 13, the input USC 17, the input buffer (IB), and the hi-drive input buffer would be excess circuitry. Only when the pin is programmed as an I/O type will all the test and functional circuitry of FIG. 1 be fully utilized.

In FIG. 2, another example 1149.1 BSC 21 is shown residing between the ICs FCL and I/O pin. This BSC is similar to the one in FIG. 1 except that it does not include an input USC. This BSC type provides full output test controllability and observability as described in the BSC 11 of FIG. 1, but only provides input test observability, not controllability. The test input observability is made possible by feeding the input buffer's output into an additional input of Mux1 of the output USC 15A. The input from the input buffer also feeds directly into the FCL. Thus with the BSC of FIG. 2, it is not possible to control the input to the FCL during test operation as seen in the BSC of FIG. 1. This type of 1149.1 BSC is used on I/O pins when only external testing (IC to IC interconnect testing) is desired. The BSC of FIG. 2 is not advantageous for programmable technologies since it does not provide the user with full pin test programming control, i.e. it does not provide the user with the option of an input test capability (since it has no test input controllability) as does the BSC of FIG. 1. Therefore, the BSC of FIG. 2 is useful mainly in custom IC designs.

In FIG. 3, an example P1149.2 BSC 31 is shown residing between the FCL and I/O pin. This BSC is similar to the BSC of FIG. 1 in that it provides full input and output test controllability and observability of I/O pins. The difference between the existing 1149.1 and developing P1149.2 boundary scan standards is that the P1149.2 standard allows the capture/shift memories (Mem1s) of the boundary scan cells to be shared between test and functional operation. For example, in FIG. 3 the Mem1s (shaded to indicate functional circuitry) in the control, output, and input paths are functionally required components of the IC's I/O structure. If boundary scan was not implemented in the IC, the Mem1s would be directly wired between the FCL and input and 3-state output buffers. However, when P1149.2 boundary scan is included in the IC, as shown in FIG. 3, the functional Mem1s serve as the capture/shift memory for the control, output, and input USCs 33, 35 and 37, respectively. The dedicated test circuitry of each control, output, and input USC is shown non-shaded, to contrast against the shaded shared Mem1s which are part of the IC's functional circuitry.

In normal IC operation, the Mem1s of the P1149.2 USCs of FIG. 3 are used to register functional control, output, and input signals associated with normal I/O operation. During normal IC operation, functional control from the FCL passes through the control USC's Mux1, Mem1 and Mux2 to be input to the 3SOB, functional output from the FCL passes through the output USC's Mux1, Mem1 and Mux2 to be input to the 3SOB, and functional input from the I/O pin passes through the input buffer, the input USC's Mux1, Mem1 and Mux2, and the hi-drive buffer to be input to the FCL. Since the Mem1s of the P1149.2 BSC of FIG. 3 are used functionally, it is not possible to shift data through them while the IC is in normal operation mode, as can be done using the Mem1s of FIG. 1 which are dedicated test circuitry.

It should be noted that the hi-drive buffer is shaded (functional circuitry) in FIG. 3 because Mem1 is always interposed between IB and FCL, thus preventing IB from driving FCL directly, and typically requiring a hi-drive buffer even without any test circuitry.

In test operation, the Mem1s of the P1149.2 USCs of FIG. 3 are used to register test control, output, and input signals associated with test I/O operation. During test operation, test control from control Mem1 passes through the control USC's Mem2 and Mux2 to be input to the 3SOB, test output from output Mem1 passes through the output USC's Mem2 and Mux2 to be input to the 3SOB, and test input from input Mem1 passes through the input USC's Mem2 and Mux2 to be input to the FCL. During test operation, the capture/shift operation of Mux1 and Mem1, and the update operation of Mux2 and Mem2 is the same as described in the BSC of FIG. 1.

Because the Mem1s of the P1149.2 BSC of FIG. 3 cannot be shifted during normal IC operation, there is no way to shift in and update known test data into the Mem2s of the USCs before switching from functional to test operation, i.e. when Mux2 switches from outputting data from Mem1 (functional operation) to outputting data from Mem2 (test operation).

Therefore the P1149.2 BSC will initially output unknown test data when the IC switches from functional to test operation. So while the P1149.2 BSC reduces the test logic overhead by the sharing of Mem1 for test and functional operation, the results are that the P1149.2 BSC enters test mode without knowing the state of the I/O pin, which can cause voltage contention between connected IC pins until test data is shifted in and updated from the BSC to the pins. This BSC of FIG. 3, like the BSC of FIG. 1, can be used in programmable technologies since it provides full input and output test controllability and observability. However, unlike the BSC of FIG. 1, the BSC of FIG. 3 does not provide for entry into test operation with known data in Mem2, which results in an unknown state at the I/O pin until a shift in and update operation is performed.

In FIG. 4, another example P1149.2 BSC 41 is shown residing between the FCL and I/O pin. This BSC is similar to the BSC of FIG. 2 in that it does not include an input USC and input observability is provided by an added input on Mux1 of the output USC 35A. Also the BSC of FIG. 4 is similar to the BSC of FIG. 3 in that it shares Mem1s between functional and test operations. Like the BSC of FIG. 2, this P1149.2 BSC is used on I/O pins when only external testing (IC to IC pin interconnect testing) is desired. Also like the BSC of FIG. 2, the BSC of FIG. 4 is not advantageous for programmable technologies since it does not provide the user with full pin test programming control (no test input controllability). Like the BSC of FIG. 3, the BSC of FIG. 4 enters test operation with unknown data in Mem2 and therefore the state of the I/O pin is unknown until the first shift in and update operation is performed.

FIG. 4 includes a functional input memory FIM (shaded as functional circuitry) at the IB output because the functionality of the IC requires the input data to be registered, as mentioned with respect to FIG. 3. The FIM of FIG. 4 is the same memory circuit as the Mem1 of USC 37 in FIG. 3, but is not shared with the BSC 41 of FIG. 4 and thus does not perform the Mem1 function illustrated in FIG. 3. The hi-drive buffer of FIG. 4 is shaded as functional circuitry because IB does not directly drive FCL, the same as in FIG. 3.

The dashed lines in FIGS. 1–4 represent optional connections between the USC outputs and Mux1s, thus permitting the USC output to be captured in Mem1 and shifted out for purposes of testing the USC itself.

In view of the foregoing, it is desirable to provide bi-directional scan cells with less test circuitry and to reduce the amount of unused circuitry when pins in programmable technologies are not programmed as I/O pins.

It is also desirable to avoid potential voltage contention problems due to the existence of unknown test data at IC pins upon initially switching into test operation in scan cells that share the Mem1 between functional and test operations.

It is further desirable to provide a bi-directional scan cell which permits input controllability without requiring a hi-drive buffer for FCL inputs.

The present invention provides a hi-directional scan cell design which implements the prior art Mem2 and Mux2 functions with less test circuitry than the prior art, provides input controllability without requiring a hi-drive buffer for FCL inputs, and includes an output latch circuit that resolves voltage contention at the IC pin. The invention also provides another low overhead scan cell output latch design which utilizes bus holder circuitry.

BRIEF DESCRIPTION OF THE DRAWINGS

FIG. 5 illustrates an exemplary bi-directional scan cell according to the present invention.

FIGS. 5A–5B illustrate examples of the switching elements of FIG. 5.

FIG. 8 illustrates an exemplary bi-directional scan cell similar to FIG. 7 but without input controllability.

FIGS. 14–17 illustrate exemplary scan cells which implement the voltage contention resolution feature of the present invention.

DETAILED DESCRIPTION OF THE INVENTION

Figure 1:
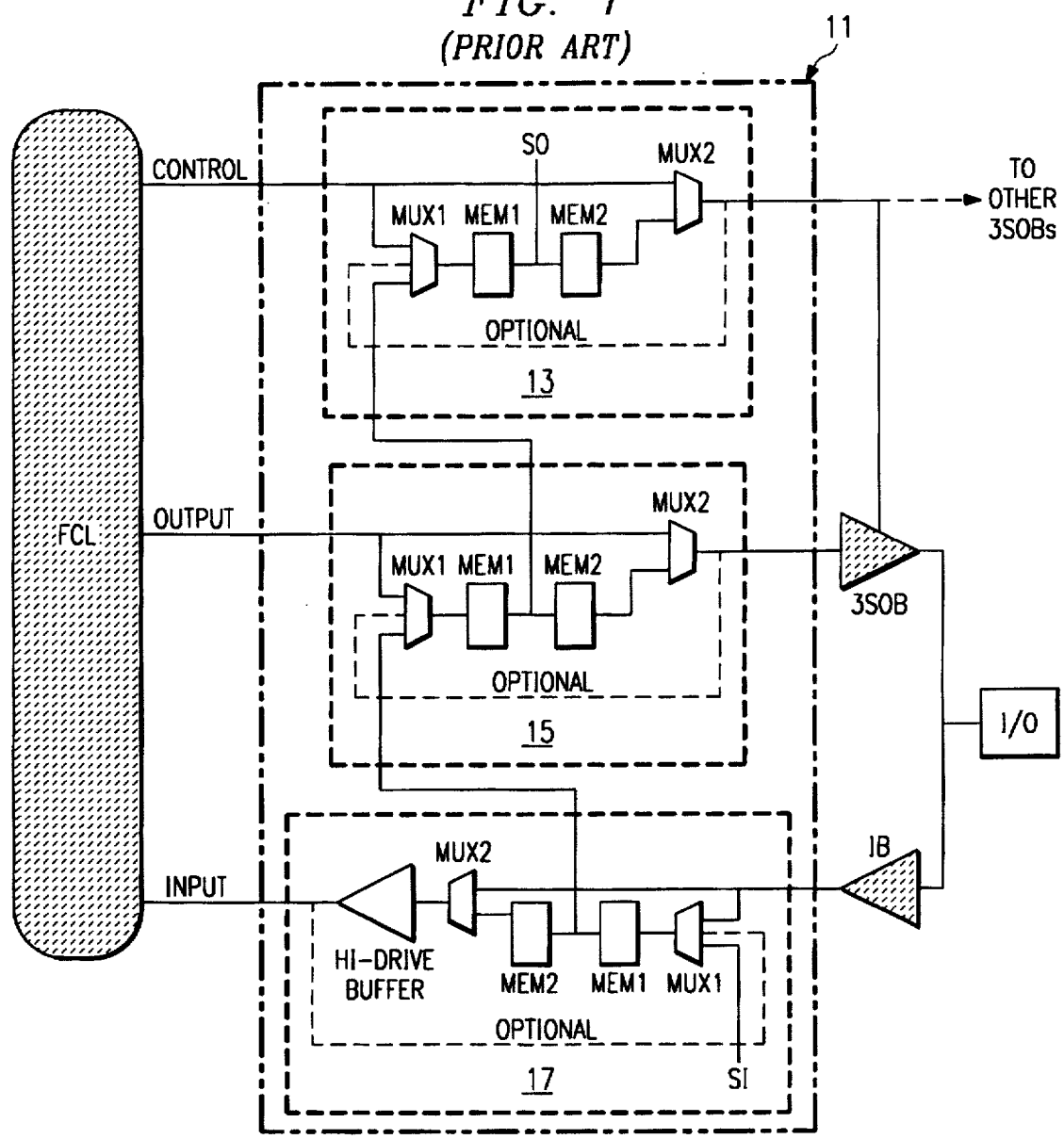
FIGS. 1–4 illustrate prior art bi-directional scan cell designs.

In FIG. 5, an exemplary BSC 51 according to the invention is shown. The BSC of FIG. 5 can be used in programmable technologies to provide full input and output boundary scan test capabilities as previously described with the BSC 11 of FIG. 1. Each control, output, and input USC 53, 55 and 57, respectively, of the BSC of FIG. 5 has an input section including Mux1 and Mem1. The capture and shift operation of the input sections is the same as previously described in regard to the BSC of FIG. 1. The output section of the control USC 53 includes switches S1 and S2, and a latchable control buffer (LCB). The output section of the output USC 55 includes switches S3 and S4, and a latchable output buffer (LOB). The output section of the input USC 57 includes switches S5 and S6, and a latchable input buffer (LIB). The switches S1–S6 may be implemented using, for example, transmission gates or 3-state buffers as shown in FIGS. 5A and 5B. Regardless of how the switches are implemented, the term "open" refers to the inability of a switch to pass signals from its input "I" to output "O" and the term "closed" refers to the ability of a switch to pass signals from its input to output.

The S1, S3, and S5 switches are operated (opened or closed) by a disconnect control signal (DC), and the S2, S4, and S6 switches are operated by an update control signal (UC). The DC and UC signals come from the test access port of the IC. The LCB includes a conventional internal buffer 58 (such as would normally be used to buffer internal data in the IC) which drives the 3-state control input of the 3SOB, and a weak internal feedback buffer 59 which feeds the output of the buffer 58 back to the input of the buffer 58. The LOB includes a 3SOB which drives signals out of the IC via the IC's I/O pin, and a weak buffer 56 which feeds the output of the 3SOB back to the input of the 3SOB. The LIB includes an input buffer (IB) which drives signals received from the IC's I/O pin to the FCL, and a weak buffer 54 which feeds the output of the IB back to the input of the IB.

During normal IC operation, S1, S3, and S5 are closed by DC, and S2, S4, and S6 are opened by UC. S1, S3 and S5, when closed, have sufficient output drive strength to overdrive the weak feedback buffers 59, 56 and 54. In this normal operation mode, control from FCL passes through the control USC's S1 and LCB to control the operation of the 3SOB, output from FCL passes through the output USC's S3 and LOB to be output from the I/O pin, and input from the I/O pin passes through the input USC's S5 and LIB to be input to the FCL. In normal operation, the input sections (i.e. Mux1 and Mem1) of each USC can be operated to capture data (control in USC 53, output in USC 55, input in USC 57) and shift the captured data from SI to SO as previously described with respect to FIG. 1.

During test operation, S1, S3, and S5 are opened by DC, and S2, S4, and S6 are controlled by UC. Prior to entering test operation (i.e. while still in normal operation with S2, S4 and S6 opened), test data is shifted into the input sections of the USCs so that the respective Mem1s will contain the test data to be initially updated to the LCB, LOB, and LIB of the USCs when test operation is entered. Upon entry into test operation, S1, S3, and S5 are opened by DC and S2, S4, and S6 are momentarily closed by UC. The momentary closing of S2, S4, and S6 allows the test data previously shifted into the Mem1s of the control, output, and input USCs to be transferred respectively into the LCB, LOB, and LIB. S2, S4, and S6, when closed, have sufficient output drive strength to overdrive the weak feedback buffers 59, 56 and 54 to input the test data from the respective Mem1s. After the test data has been input to the LCB, LOB, and LIB, UC opens S2, S4, and S6 and allows the feedback buffers of the LCB, LOB, and LIB to maintain the test data via the feedback they provide.

Following entry into test operation and the aforementioned momentary closing of S2, S4 and S6, the BSC 51 is operated to repeat the steps of capturing test data into the input section of the USCs (i.e. into the Mem1s), shifting data through the input section of the USCs from SI to SO to thereby output the captured test data and input new test data, and updating the new test data into the output section of the USCs (i.e. to the LCB, LOB, and LIB). During each update operation, S2, S4, and S6 are momentarily closed to update the new test data shifted into the Mem1s of the control, output, and input USCs to the LCB, LOB, and LIB, respectively. During the capture and shift operations, S2, S4 and S6 are held open to isolate the LCB, LOB and LIB from the scan path between SI and SO.

The dashed connections in FIG. 5 and all subsequent drawing figures provide optionally the capability of testing the USCs themselves by capturing the USC outputs into the Mem1s and shifting out the captured USC outputs for comparison to the expected USC outputs.

In the BSC of FIG. 5, note that: (1) the combination of S1, S2, and LCB provide the Mux2 and Mem2 function of the control USC 13 of FIG. 1 with less circuitry overhead than in USC 13, (2) the combination of S3, S4 and LOB provide the Mux2 and Mem2 function of the output USC 15 of FIG. 1 with less circuitry overhead than in USC 15, (3) the combination of S5, S6, and LIB provide the Mux2 and Mem2 function of the input USC 17 of FIG. 1 with less circuitry overhead than in USC 17, (4) the 3SOB is shared between test and functional operations and provides part of the Mem2 function of the output USC 55, (5) the IB is shared between test and functional operations and provides part of the Mem2 function of the input USC 57, (6) the hi-drive buffer of the BSC of FIG. 1 is not required in the BSC of FIG. 5 since the input buffer drives the FCL directly, and thus the aforementioned test circuitry overhead and signal delays caused by the hi-drive buffer are eliminated using the BSC of FIG. 5, (7) the Mem2 function precedes the Mux2 function in FIG. 1, while the Mem2 function (including LCB, LOB, LIB) follows the Mux2 function (i.e. S1&S2, S3&S4, and S5&S6) in FIG. 5, and (8) opening S5 permits USC 55 to update data to the I/O pin while USC 57 independently updates data to FCL.

In addition to reducing the BSC circuit size and eliminating the input signal delay of the prior art BSC of FIG. 1, the BSC of FIG. 5 provides a further advantage in that, if the I/O pin were shorted to ground and a logic one was updated to the LOB from Mem1 via momentary closure of S4, the LOB would attempt to output the logic one over the short to ground only during the momentary closing of S4. After S4 opens, the feedback buffer 56 of the LOB will cause the 3SOB to output a logic zero and remove the output drive contention. A similar corrective action would occur if the I/O pin were shorted to a supply voltage and a logic zero were updated to the LOB. So the BSC of FIG. 5 also provides protection against shorted output pins, whereas the prior art BSC of FIG. 1 does not. The exemplary BSCs described below and shown in FIGS. 6, 7, and 8 also provide this reduced test circuit implementation style and self-correcting output capability.

Figure 6:
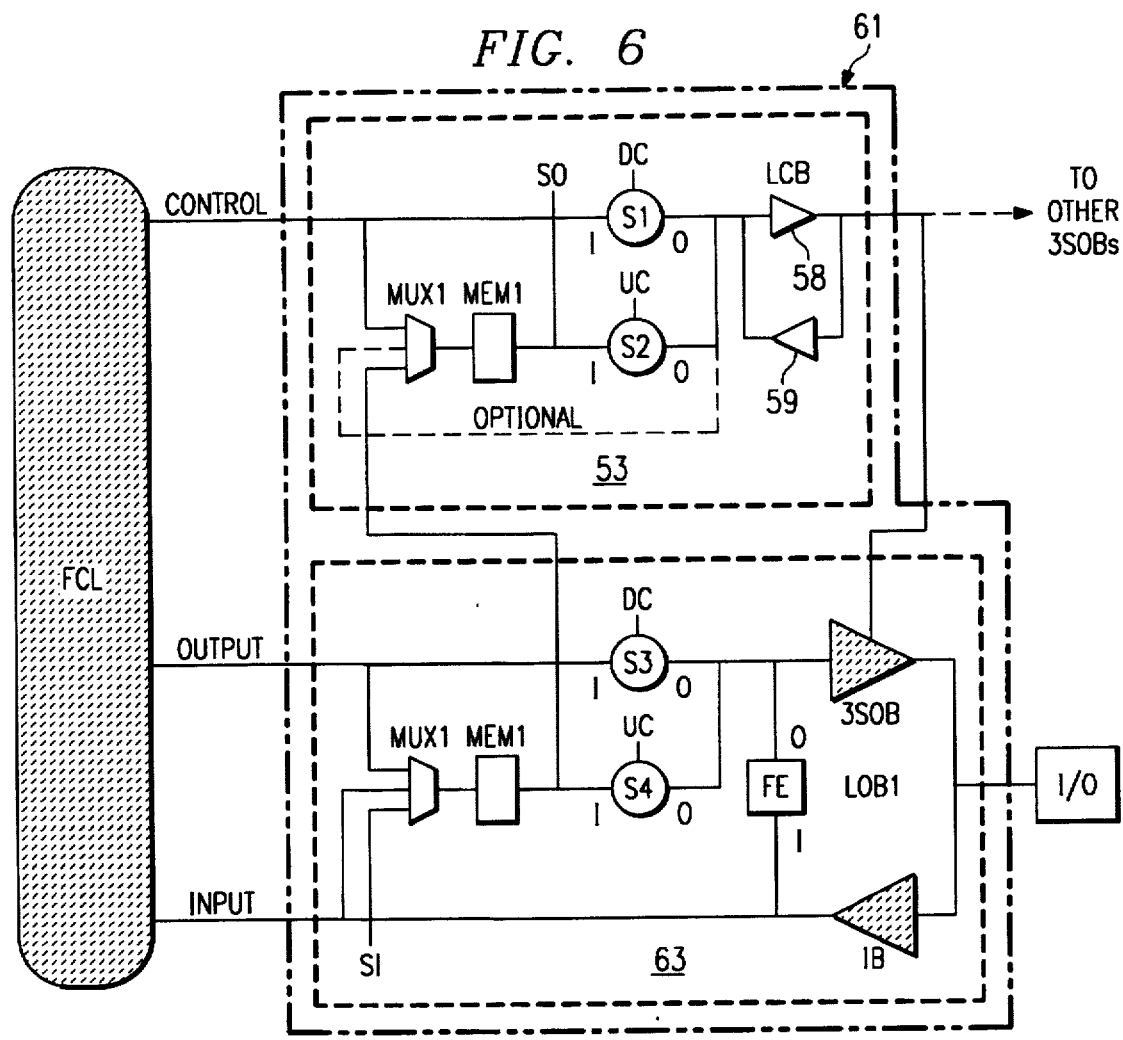
FIG. 6 illustrates an exemplary bi-directional scan cell similar to FIG. 5 but without input controllability.
Figure 6A:
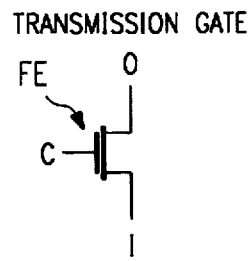
FIGS. 6A–6C illustrate examples of the feedback element of FIG. 6.
Figure 6B:
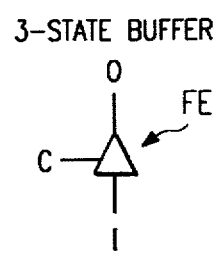
Figure 6C:
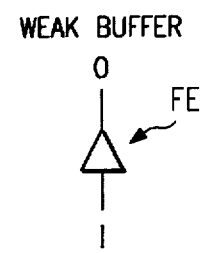

In FIG. 6, another exemplary BSC 61 according to the invention is shown. The BSC of FIG. 6 does not provide test input controllability and thus is directed primarily at custom technologies for the reasons discussed above relative to FIG. 2. The BSC of FIG. 6 is similar in operation to that described in the BSC of FIG. 5 in regard to using S1, S2, and LCB to achieve the Mux2 and Mem2 test circuit functions in the control USC 53. However, the BSC 61 is different from the BSC 51 in FIG. 5 in realizing the Mux2 and Mem2 test circuit functions in the output USC 63. Since test input controllability is not implemented in the BSC of FIG. 6, the LOB1 of the output USC 63 can take advantage of the existing input buffer IB to provide the feedback required to form the Mem2 function. This is achieved by using a feedback element (FE) connected between the input of the 3SOB and the output of the IB. The feedback element can be designed using, for example, a transmission gate, a 3-state buffer, or a weak buffer as shown in FIGS. 6A–6C. An advantage of using a weak buffer for FE is that no control signal (C) and its routing is required, as would be the case if a transmission gate or 3-state buffer were used for FE.

In normal IC operation, the FCL outputs control and output data to the 3SOB of the I/O pin via S1 and S3 (S2 and S4 are opened), and input data from the I/O pin is input to the FCL via the IB. If FE is implemented with a transmission gate or 3-state buffer, it will be opened as well. If FE is implemented with a weak buffer, the output from S3 will be sufficient to overdrive the weak buffer output.

In test mode, S1 and S3 are opened and S2 and S4 are operated as described in the BSC of FIG. 5 to update test data to the LCB and LOB1. During update operations, S2 and S4 are momentarily closed to transfer data from the Mem1s to the LCB and LOB1. After the update operation, LCB holds the data via the feedback buffer 59 and LOB1 holds the data via the feedback provided by IB and FE. During test mode, if a transmission gate or 3-state buffer were used for FE it would be open/disabled before S4 is momentarily closed, but would be closed/enabled before S4 is opened, to provide the feedback. If the transmission gate or 3-state buffer has sufficiently weak output drive to be overdriven by S4 then it could be closed/enabled throughout test operation. If a weak buffer is used for FE, the output from S4 will be sufficient to overdrive the weak buffer output.

The difference in the LOB1 of FIG. 6 and the LOB of FIG. 5 is that the LOB1 of FIG. 6 uses the IB and FE as the feedback latching circuitry. While the same LOB implementation as seen in FIG. 5 could be used in FIG. 6, the advantage in the LOB1 of FIG. 6 is that a standard I/O buffer combination can be made to work as needed simply by connecting the FE between the 3SOB and IB as shown. In FIG. 5, a specially designed I/O buffer is required which includes the feedback buffers 56 and 54 on the 3SOB and IB sections of the I/O buffer. Another advantage is that the FE is on the FCL side of 3SOB and IB, and thus does not adversely affect pin loading (capacitance) or circuitry associated with the pin such as electrostatic discharge (ESD) protection circuitry and voltage level shifting circuitry.

The USC 63 does not require an additional dashed line connection to test itself, because the latched output of USC 63 is already available at the output of IB, which is already input to Mux1.

It should be noted that the function of the feedback buffers 54, 56, and 59 of FIG. 5 could also be implemented by using the circuit examples given for the FE of FIG. 6, and by controlling those circuit examples in the manner described above relative to FIG. 6.

Figure 3:
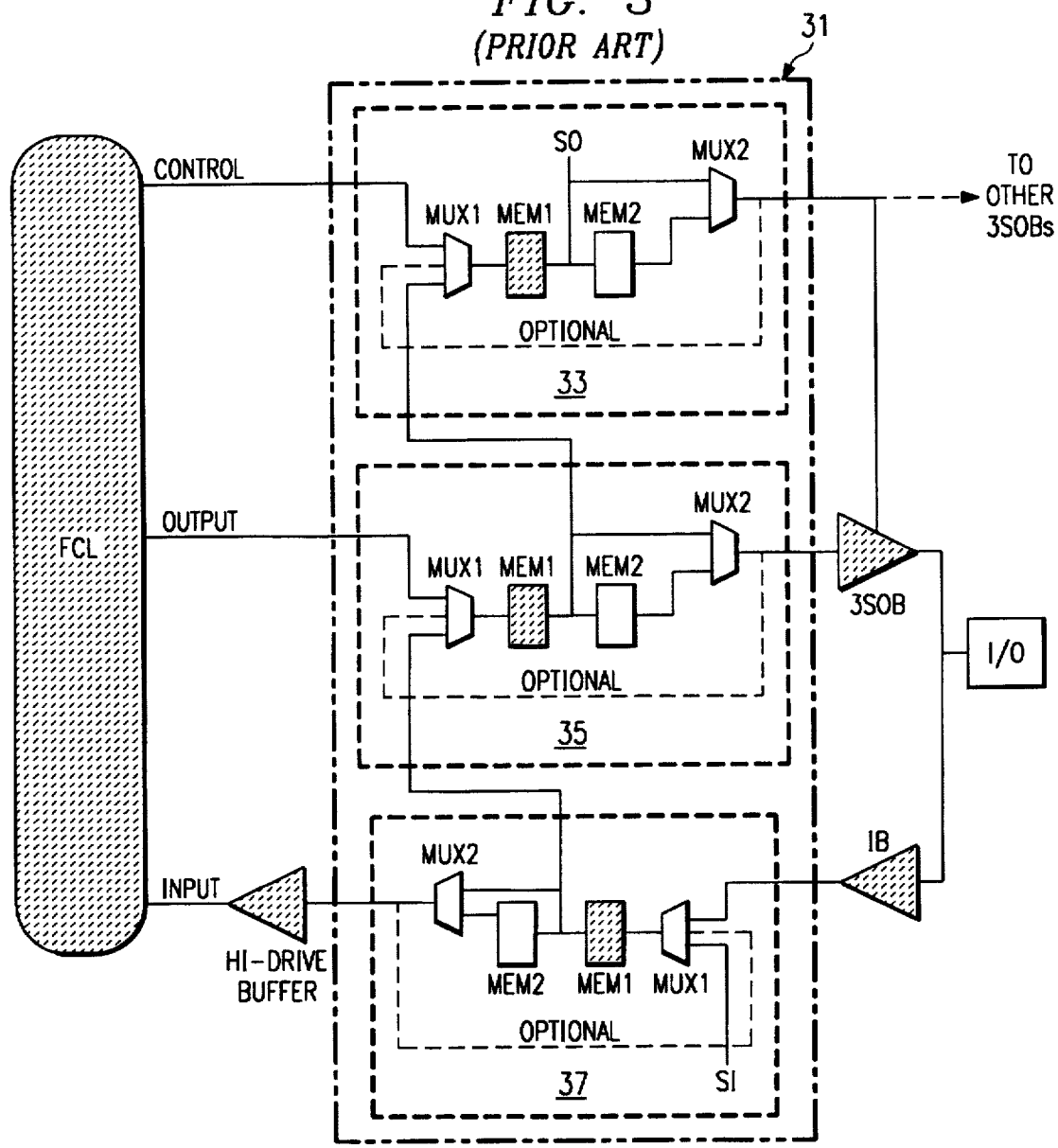
Figure 7:
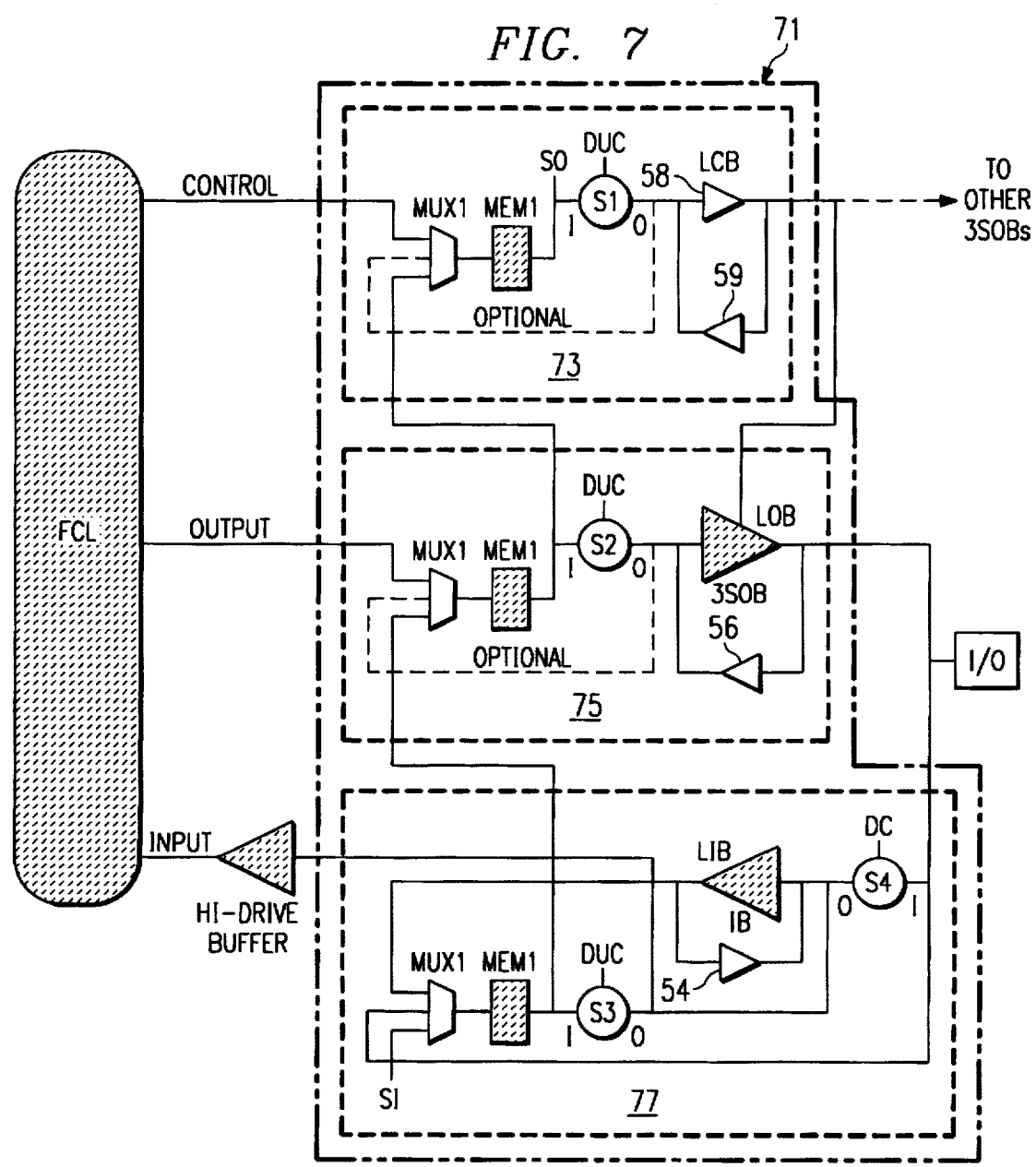
FIGS. 7–7B illustrate exemplary bi-directional scan cells with shared memory according to the present invention.

In FIG. 7, another exemplary BSC 71 according to the invention is shown. The BSC of FIG. 7 can be used in user programmable technologies to provide full input and output boundary scan test capabilities. Each control, output, and input USC 73, 75 and 77, respectively, of the BSC of FIG. 7 has an input section including a Mux1 and a shared Mem1. The capture and shift operation and limitations of the input section are the same as previously described in regard to the BSC of FIG. 3. The output section of the control USC 73 includes S1 and LCB. The output section of the output USC 75 includes S2 and LOB. The output section of the input USC 77 includes S3 and LIB. S4 is provided between the I/O pin and the input to the IB to allow disconnecting the I/O pin from the IB during test operations. Opening S4 during test operation allows the output USC 75 to update data to the I/O pin while the input USC 77 independently updates data to the FCL, via S3. The hi-drive buffer is shaded as functional circuitry in FIG. 7 for the same reasons given above relative to FIG. 3.

S1, S2, and S3 in FIG. 7 are operated by a disconnect/ update control (DUC) signal and S4 is operated by a disconnect control (DC) signal. The function of the DC signal has been previously defined. The new DUC signal is a combined disconnect and update signal since the disconnect and update operations are both performed by single switches S1, S2, and S3, instead of using two switches per USC for the disconnect and update operations as shown in FIG. 5. The use of single switches for the output sections of the control and output USCs is possible because the Mem1s thereof are shared and are normally connected in the control and output signal paths during functional operation. Likewise, a single switch for the output section of the input USC is possible since the Mem1 thereof is shared and its output is normally connected to the FCL during functional operation. Thus, the BSCs of FIGS. 5 and 7 differ in that the outputs of the shared Mem1s of FIG. 7 are normally connected in the functional signal paths (control output, input) and can therefore use a single switch for disconnect and update, whereas the outputs of the non-shared Mem1s of FIG. 5 are not normally connected in the functional signal paths and thus two switches are used for disconnect and update.

During normal IC operation, S1, S2, S3, and S4 are closed. In this mode, control from FCL passes through the control USC's Mux1, Mem1, S1, and LCB to the 3SOB, output from FCL passes through the output USC's Mux1, Mem1, S2 and LOB to the I/O pin, and input from the I/O pin passes through S4 and the input USC's LIB, Mux1, Mem1, and S3 to the hi-drive buffer and FCL. In normal operation, the input sections of the USCs cannot be operated to capture data and shift data from SI to SO since the shared Mem1s are used functionally.

During test operation, S4 is opened and S1, S2, and S3 are opened and closed as required to perform the update operation. Since the Mem1s are shared, preloading of test data into the LCB, LOB, and LIB is not possible for the reasons described with respect to the BSC of FIG. 3 (i.e. cannot shift data through shared Mem1s during normal operation since they are being used functionally). Therefore, when test operation is entered, the data that is initially updated to and stored in the LCB, LOB, and LIB (when switches S1, S2 and S3 are initially opened) will be the last functional data that existed on the corresponding signal path before test operation was entered. If a voltage conflict occurs at the I/O pin in FIG. 7, the LOB will correct the conflict by changing output states via the feedback buffer 56 as previously described in the BSC of FIG. 5.

Following entry into test operation, the BSC 71 is operated to repeat the steps of capturing test data into the input section of the USCs, shifting data through the input section of the USCs to output the captured test data and input new test data, and updating the new test data into the output section of the USCs, as previously described.

The test data shift path between SI and SO in FIG. 7 includes direct connection of the Mem1s via the Mux1s, whereas the normal functional signals from the control Mem1 to 3SOB and from the output Mem1 to the I/O pin and from the input Mem1 to the FCL pass through S1, S2, and S3, respectively. In normal operation, S1, S2, and S3 are closed to pass normal functional data from the Mem1s to the I/O pin, 3SOB and FCL. During capture and shift operations, S1, S2, and S3 are opened to prevent test data being captured and shifted through the Mem1s of the USCs from being seen at the I/O pin and FCL. While S1, S2, and S3 are opened, the data stored in the LCB, LOB, and LIB is stable. After new test data has been shifted into the Mem1s of the USCs, S1, S2, and S3 are momentarily closed to update the new test data to the LCB, LOB, and LIB. Thus S1, S2, and S3 serve to isolate the I/O pin and FCL from seeing the capturing and shifting of test data through the USCs.

USC 77 of FIG. 7 does not require a dashed line connection to test itself because the output of USC 77 is already available to Mux1 by virtue of the Mux1 connection to the output of IB.

The BSC 71A of FIG. 7A is similar to BSC 71 of FIG. 7 except for the design of input USC 72, which utilizes feedback buffer 54 in combination with the hi-drive buffer to realize a latchable input buffer LIB1 on the output side of S3. BSC 71A does not require switch S4 from FIG. 7 because LIB1 is sufficiently isolated from the I/O pin.

Figure 7B:
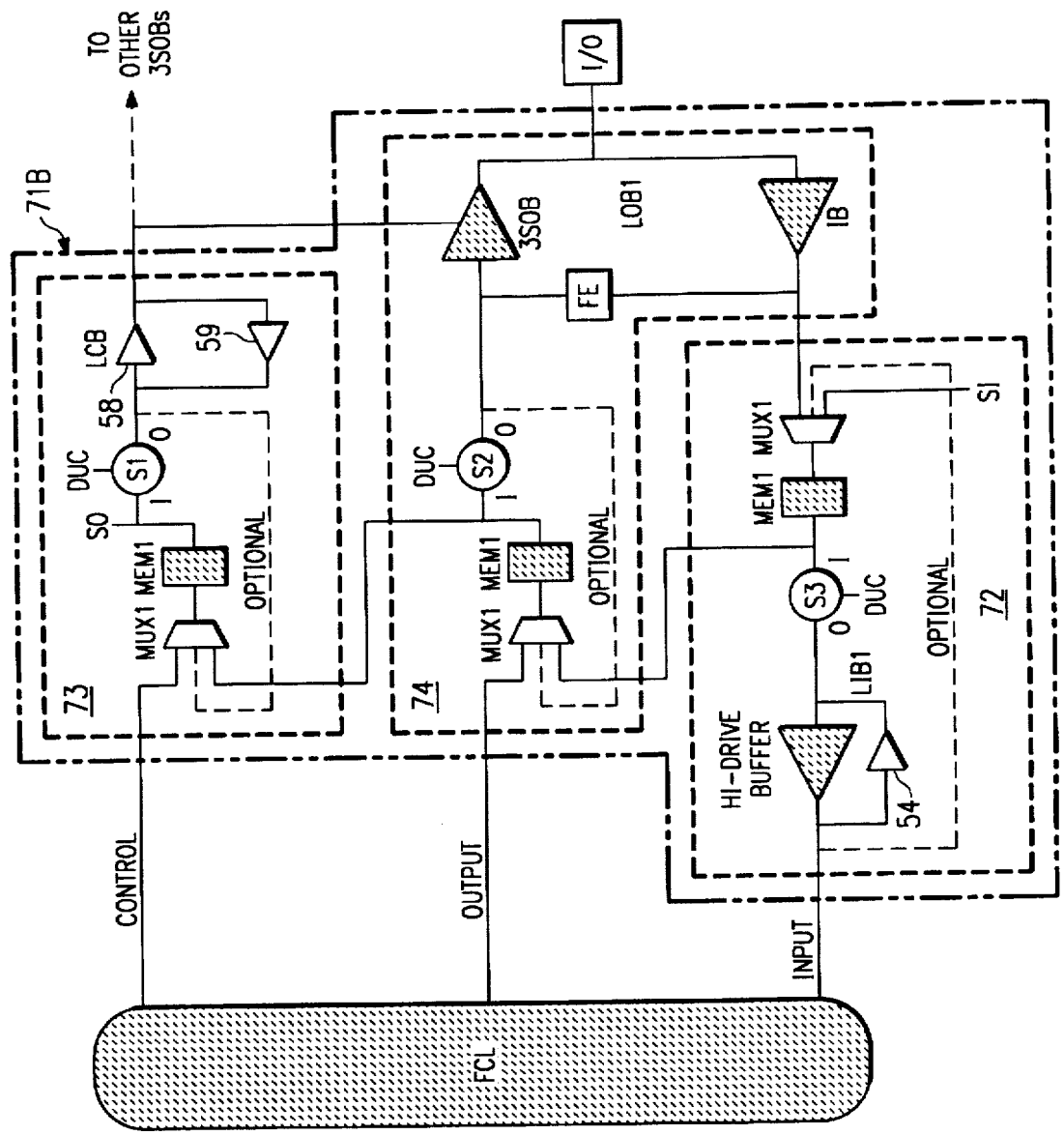

The BSC 71B of FIG. 7B is similar to BSC 71A of FIG. 7A except IB is combined with 3SOB and FE to realize LOB1 in output USC 74. Thus, BSC 71B implements the LOB1 design even with an input USC 72 that provides input controllability.

Figure 4:
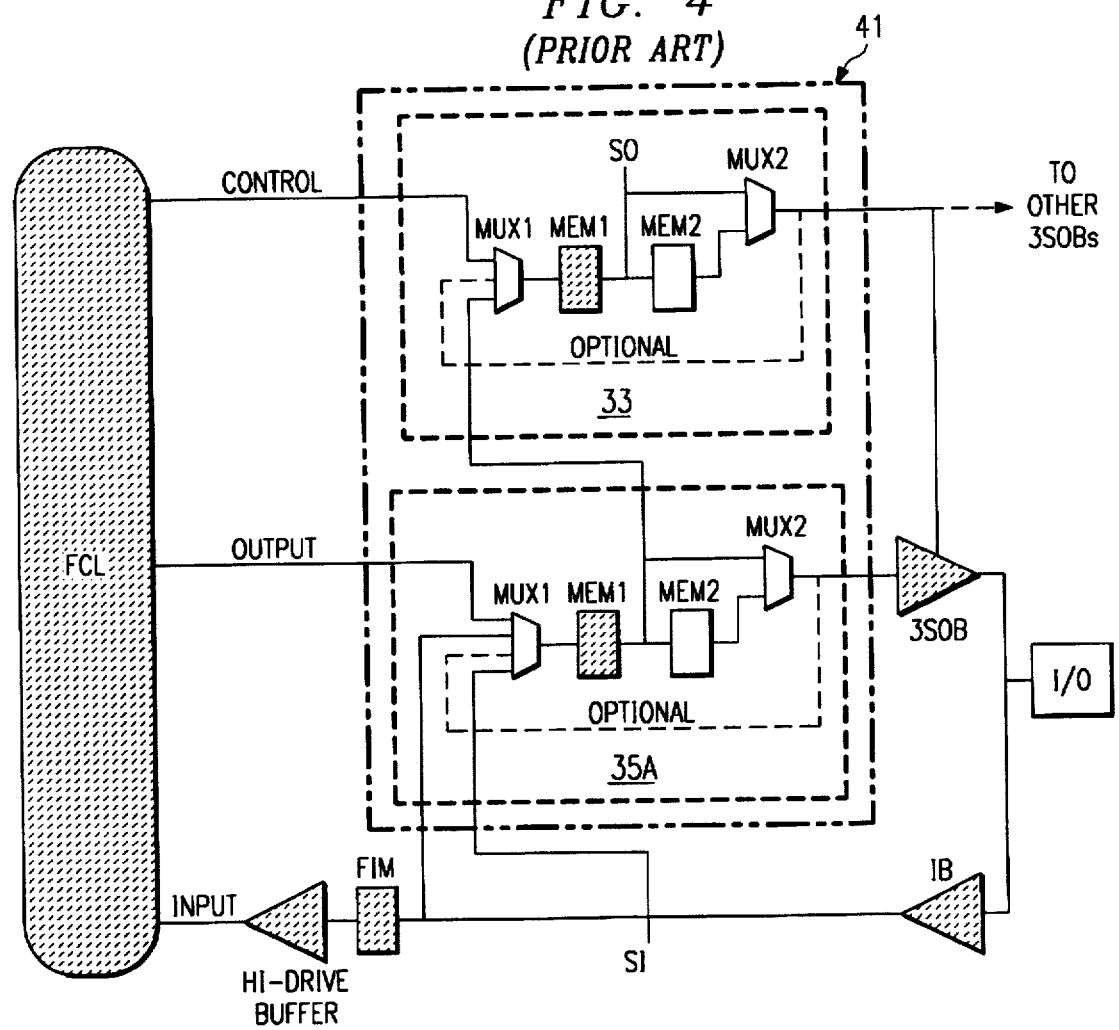

In FIG. 8, another exemplary BSC 81 according to the invention is shown. The BSC of FIG. 8 includes shared Mem1s as in FIG. 7, but does not provide test input controllability and therefore is most advantageous for use with custom technologies. The BSC 81 otherwise operates generally the same as the BSC 71 described in FIG. 7. BSC 81 also utilizes the LOB1 structure of FIG. 6. Input test observability is provided in FIG. 8 by an additional input to the Mux1 of the output USC 83, similar to that described in the BSC of FIG. 4. The FIM and hi-drive buffer are included and shaded as functional circuitry for the reasons given above relative to FIG. 4. The USC 83 does not require a dashed line connection to test itself for the same reasons given above relative to USC 63 of FIG. 6.

While the updating of data from the Mem1s to the LCBs, LOBs, and LIBs in FIGS. 5, 6, 7, and 8 has been described as being a momentary operation (momentary closing of the switches), the update could occur at all times during test operation, except when the input sections of the USCs (Mux1 and Mem1) are capturing and shifting data. In such operation, the update switches would be opened during the capture and shift operations of the input sections of the USCs and closed at all other times during test operations. Opening the update switches during capture and shift prevents the LCBs, LOBs, and LIBs from seeing data changes from the Mem1s during the capture and shift operations. A disadvantage of having the update switches closed is that the LOB cannot correct for voltage contention problems at the pin when its update switch is closed.

In another alternate technique, the update switches could be held open during capture and shift operations and, during all other time intervals during test operation, the UC signal could be periodically pulsed active such that the update switches are periodically closed momentarily to provide a periodic update operation. Using this periodic update technique, the LOB would correct pin voltage contention problems only during the periods that its update switch is open.

As demonstrated above, the invention provides the following exemplary advantages over prior art boundary scan cells. The mount of circuitry for BSCs at I/O pins is reduced using the invention, especially in user programmable technologies where all pins are considered I/O and therefore must implement a full featured BSC on each pin. The self-correcting output feature of the invention allows voltage contention on outputs to be quickly resolved. The delay through the Mux2s of the prior art USCs is eliminated using the invention. Mux2 delays keep boundary scan from being implemented in high speed I/O ICs such as; SRAMs, DRAMs, CACHEs, FIFOs, ASICS, FPGAs, and processors. For example, a conventional Mux2 delay is typically 1–2 ns. If a non-boundary scan DRAM/SRAM has an I/O access time of 9 ns, a boundary scan DRAM/SRAM will have an access time of 10–11 ns. This increase in I/O access time generally cannot be tolerated and, as a result, boundary scan DRAMs/SRAMs are not generally available on the IC market. However, since the boundary scan cells of the invention eliminate the Mux2 delay, the invention provides a way for high speed I/O devices, like DRAMs/SRAMs, to include boundary scan without increasing their I/O access times. Thus the invention permits boundary scan to be designed into IC products which were previously not candidates for boundary scan due the delay of having inputs and outputs pass through Mux2.

In further exemplary embodiments of the invention, bus holder (BH) circuits are used as the output latching memory (Mem2) in input, 2-state output, 3-state output, and bi-directional boundary scan cells. Bus holders are used conventionally in the internal functional circuitry of ICs. The purpose of a bus holder is to maintain a logic state on an internal IC bus when the bus is not being driven by a buffer, (e.g. when an internal 3-state buffer connected to the bus is disabled to a high impedance output state). The present invention uses bus holders in boundary scan cells to provide the Mem2 functions described above.

Figure 9:
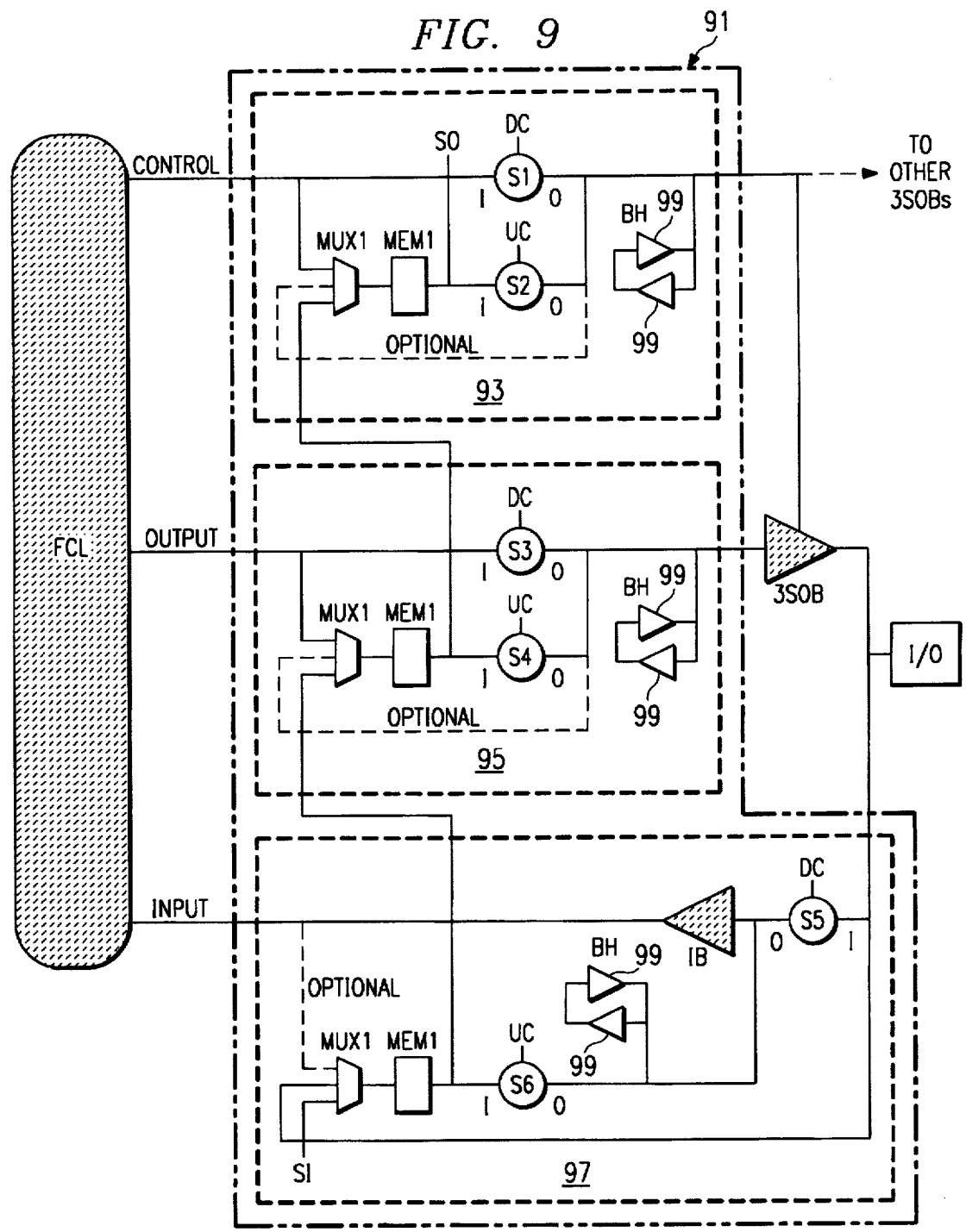
FIG. 9 illustrates another exemplary bi-directional scan cell according to the present invention.

FIG. 9 illustrates an exemplary BSC 91 comprising a control USC 93, an output USC 95, and an input USC 97. The operation and structure of the BSC 91 is similar to the one described previously in FIG. 5. The BSC of FIG. 9 includes the following features: (1) a bus holder (BH) is connected to the signal path of the control USC between the switches (S1 and S2) and the 3SOB, (2) a BH is connected to the signal path of the output USC between the switches (S3 and S4) and the 3SOB, (3) a BH is connected to the signal path of the input USC between the switches (S5 and S6) and the IB, (4) the "in series" LCB of FIG. 5 is replaced in the control USC 93 by the BH which provides the Mem2 function, and (5) the LOB and LIB of FIG. 5 are replaced in FIG. 9 by the BHs which provide the Mem2 function for the output and input USCs 95 and 97.

The BH example shown is two weak buffers 99 (or other logic functions) connected to provide a feedback input to each other. The output of the BH is connected to a signal path. The BH's weak buffers are normally overdriven by the signal path driver. However, when the signal path driver becomes disabled (e.g. 3-state), the BH's weak drive maintains the last logic state driven on the signal path. In FIG. 9, the signal path drivers for the control USC are S1 and S2, the signal path drivers for the output USC are S3 and S4, and the signal path drivers for the input USC are S5 and S6. During normal IC operation, S1, S3, and S5 are closed and overdrive the BHs. During test operation, S1, S3 and S5 are open and S2, S4 and S6 are opened and closed as required to perform boundary scan test operations as previously described in the BSC of FIG. 5. When the associated switches are opened, the BHs maintain the last logic state on the control, output, and input signal paths. Thus, the BHs provide the Mem2 functions required by the USCs in the BSC of FIG. 9.

While FIG. 9 shows BHs used in a full BSC implementation comprising control, output, and input USCs, it is clearly seen how the BHs are used on individual input, 2-state output, and 3-state output USCs. For example, in FIG. 9 it is clear that an individual input USC would include Mux1, Mem1, S5, S6, and BH, as shown at 97, and would be connected between an input buffer/pin and FCL as shown in FIG. 9. It is also clear that an individual 2-state output USC would include Mux1, Mem1, S3, S4, and BH, as shows at 95, and would be connected between the FCL and a 2-state output buffer/pin. It is also clear that an individual 3-state output USC would include the 2-state output USC just mentioned plus a control USC including Mux1, Mem1, S1, S2, and BH, as shows at 93, and would be connected between the FCL and a 3-state output buffer/pin as shows in FIG. 9. So while the example in FIG. 9 illustrates the BH used in a full BSC, it is clear how BHs can be used in individual input, 2-state output, and 3-state output boundary scan cells.

Because the BHs are not in series with the signal paths, but rather are simply attached to the signal path, they don't introduce a series delay into the signal path as do the Mux2 and LCB circuits of FIG. 1 and FIG. 5, respectively. The switches in the control, output, and input USCs of FIG. 9 isolate the signal paths to allow the BHs to serve as the Mem2 function of the USCs similar to the way the switches of FIG. 5–8 isolate the signal paths to allow the LCBs, LOBs, and LIBs to serve as the Mem2 function of the USCs. The combination of the switches and BHs in the control, output, and input USCs of FIG. 9 provides the Mux2 and Mem2 function of the USCs similar to the way the switches and LCB, LOB, and LIB of FIGS. 5–8 serve as the Mux2 and Mem2 functions of the USCs. In an output USC such as at 95, the BH is on the FCL side of the output buffer, and thus does not adversely affect pin loading (capacitance) or circuitry associated with the pin such as ESD protection circuitry and voltage level shifting circuitry.

Figure 10:
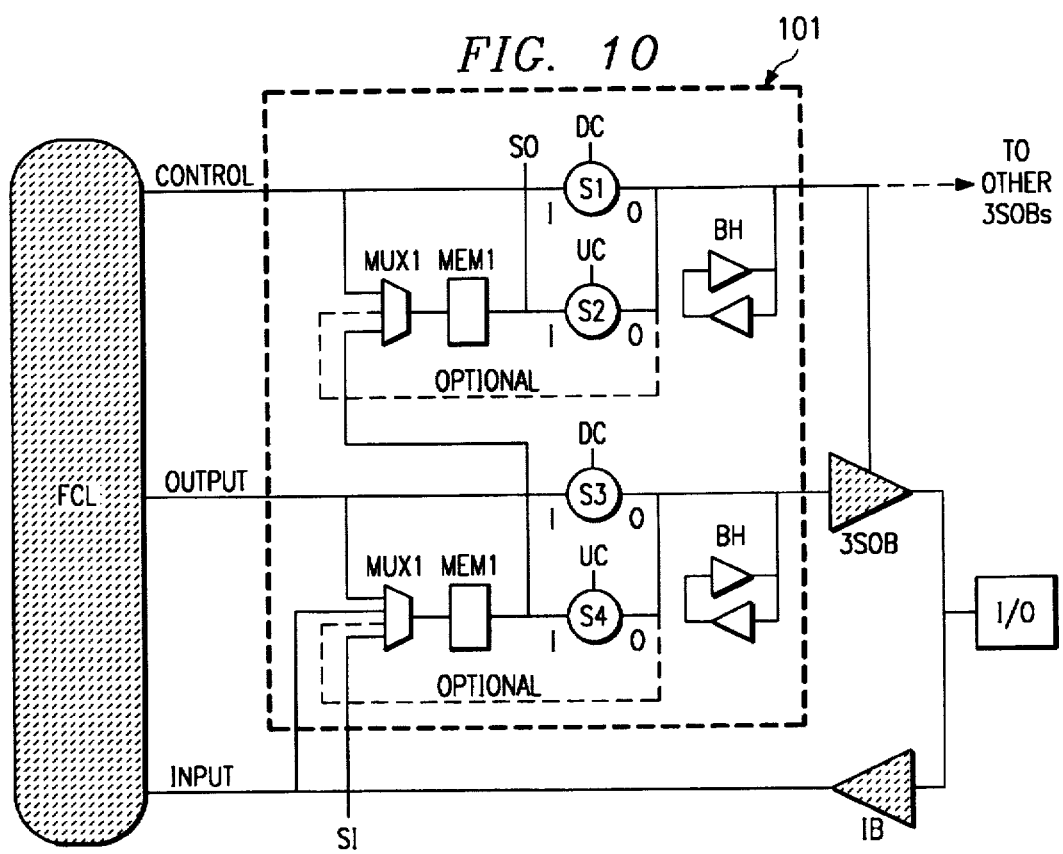
FIG. 10 illustrates an exemplary bi-directional scan cell similar to FIG. 9 but without input controllability.
Figure 11:
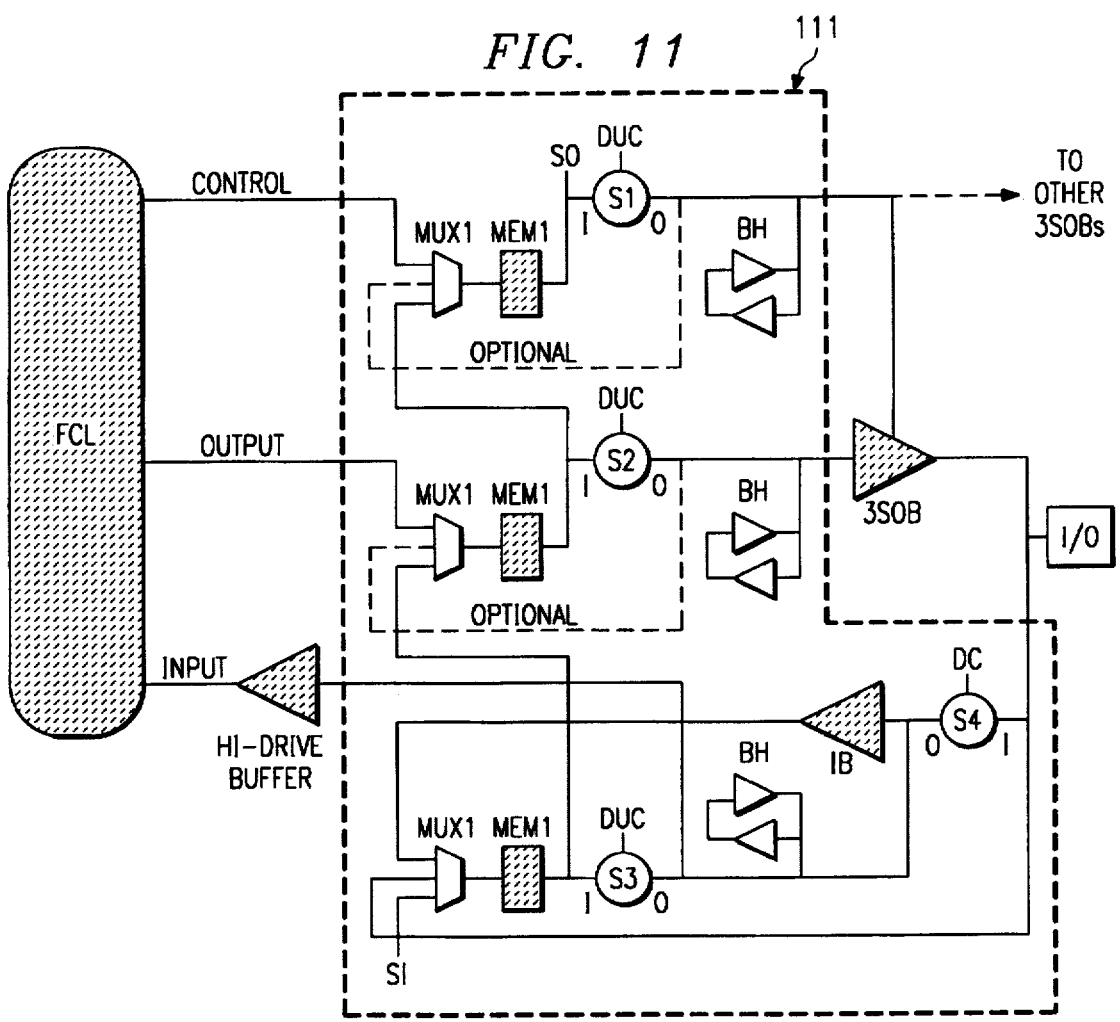
FIGS. 11–11C illustrate further exemplary bi-directional scan cells with shared memory according to the present invention.
Figure 12:
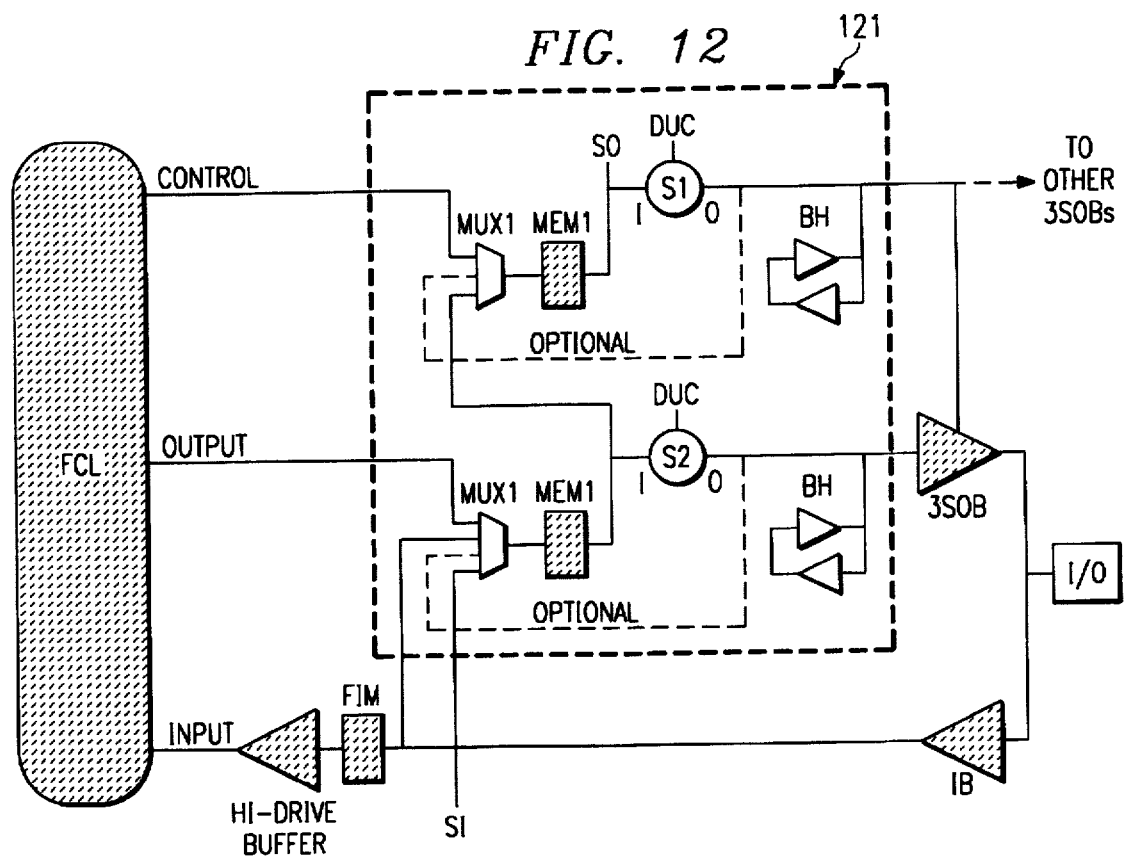
FIG. 12 illustrates an exemplary bi-directional scan cell similar to FIG. 11 but without input controllability.

FIGS. 10, 11, and 12 show further examples of BSCs to illustrate how the BHs can be used in various different types of USCs/BSCs. The operation and structure of the BSC 101 in FIG. 10 mirrors that of the BSC in FIG. 6. The operation and structure of the BSC 111 in FIG. 11 mirrors that of the BSC in FIG. 7. The operation and structure of the BSC 121 in FIG. 12 mirrors that of the BSC in FIG. 8.

Figure 11A:
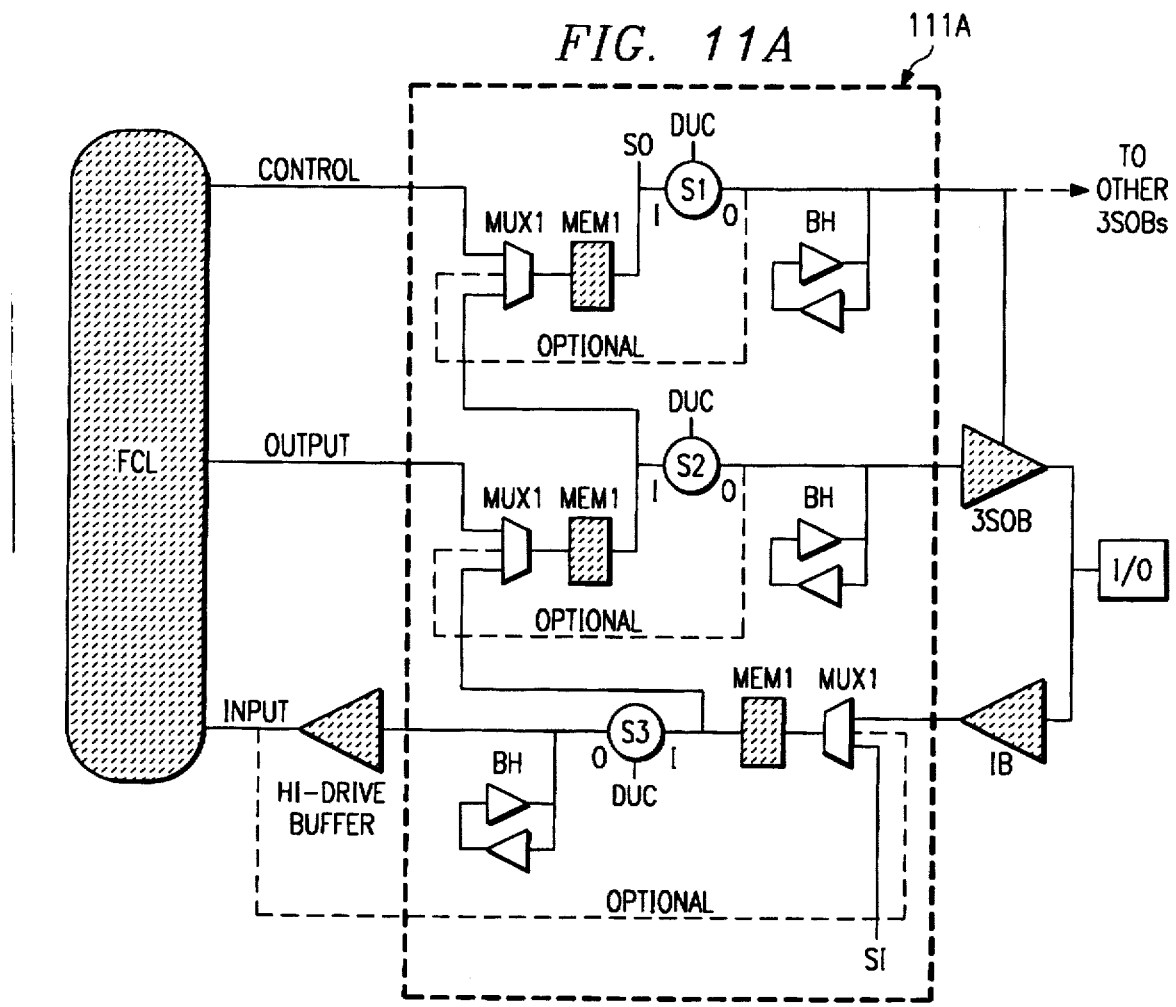

The BSC 111A of FIG. 11A is similar to BSC 111 of FIG. 11 except for the design of the input USC, wherein the bus holder BH is provided between switch S3 and the hi-drive buffer to realize the output latching function of the input USC. The BSC 111A does not require switch S4 from FIG. 11 because the output latching function of the input USC is sufficiently isolated from the I/O pin.

Figure 11B:
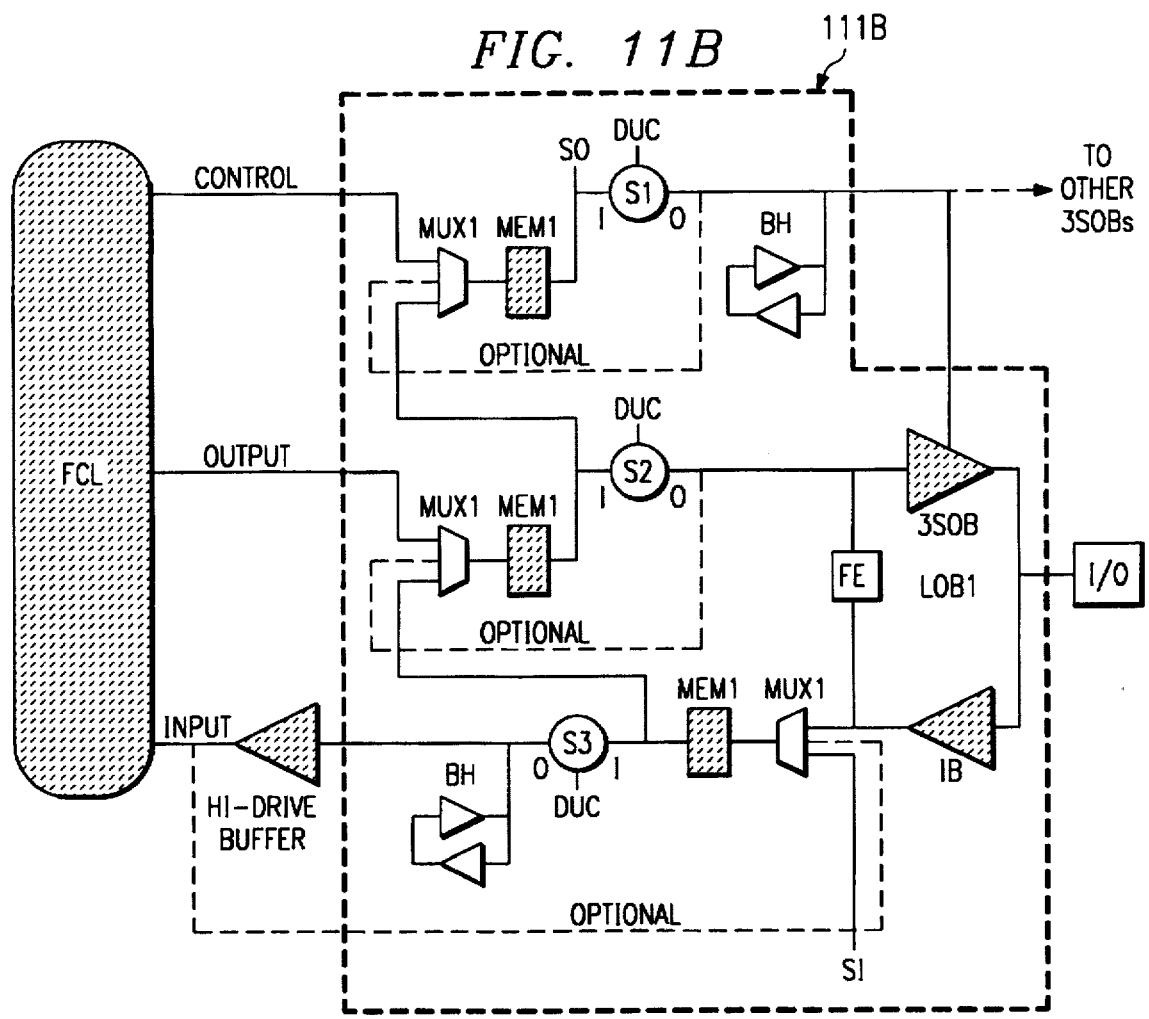

The BSC 111B of FIG. 11B is similar to BSC 111A of FIG. 11A except IB is combined with 3SOB and FE to realize LOB1 in the output USC.

The BSC 111B thus includes both input controllability and the LOB1 design.

The BSC 111C of FIG. 11C is similar to BSC 111A of FIG. 11A and BSC 111B of FIG. 11B, but uses the LOB design in the output USC.

It may be desirable, for example, to use the LOB or LOB1 (with their self-correcting voltage contention feature) in output USCs while using the BHs in the control USC or in the control and input USCs. FIGS. 11B and 11C illustrate the use of BH in control and input USCs, in combination with LOB (FIG. 11C) or LOB1 (FIG. 11B) in the output USC. The BH in the control USC helps balance the signal delays between output and control signals from the FCL to the 3SOB of FIG. 9. For example, in FIG. 5 the FCL/Mem1 control output to the 3SOB has to pass through S1/S2 and the LCB before being input to the 3SOB, whereas the FCL/Mem1 data output passes only through S3/S4 before being input to the 3SOB. The LCB is not included in the control path of FIG. 9, in contrast to FIG. 5.

Figure 13:
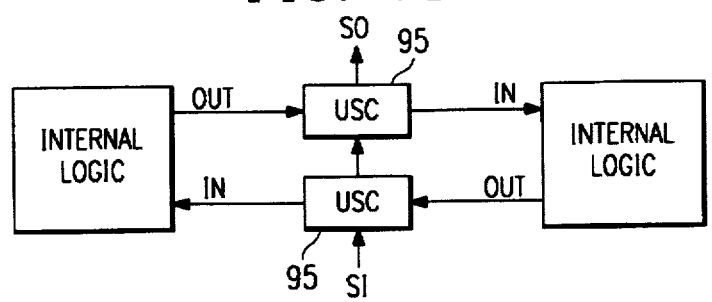
FIG. 13 illustrates unidirectional scan cells of FIG. 9 connected between internal functional logic blocks of an IC.

The above-described use of switches and BHs on scan cell outputs to provide stable test outputs during capture and shift operations is not limited to use only on boundary scan cells. Scan cells forming scan paths through the internal circuitry of an IC can also use the switch and BH arrangements shown in FIGS. 9, 10, 11, and 12 to prevent output ripple during scan operations. The internal scan cells would be connected between functional logic blocks within the FCL as shown in FIG. 13 instead of between the FCL and the input and output pin buffers. The benefits of using this approach for internal scan paths are the same as for boundary scan paths, i.e. it provides stable test output during capture and shift, it reduces the amount of circuitry needed to realize the Mux2 and Mem2 functions, and the signal delays are decreased because the signals do not have to pass through a Mux2.

Since BHs may already be used on functional busses within ICs to maintain a logic state on the busses when they are not being driven, the functional memories which normally drive the busses during functional operation can be made scannable (i.e. the Mux1 and "shared" Mem1 arrangement shown in FIGS. 11 and 12 can be implemented), and isolation switches (as shown at S1–S4 in FIGS. 11 and 12) can be provided for operation as required to cause the BHs to maintain test data on the bus or update new test data onto the bus from the scannable memories.

Figure 2:
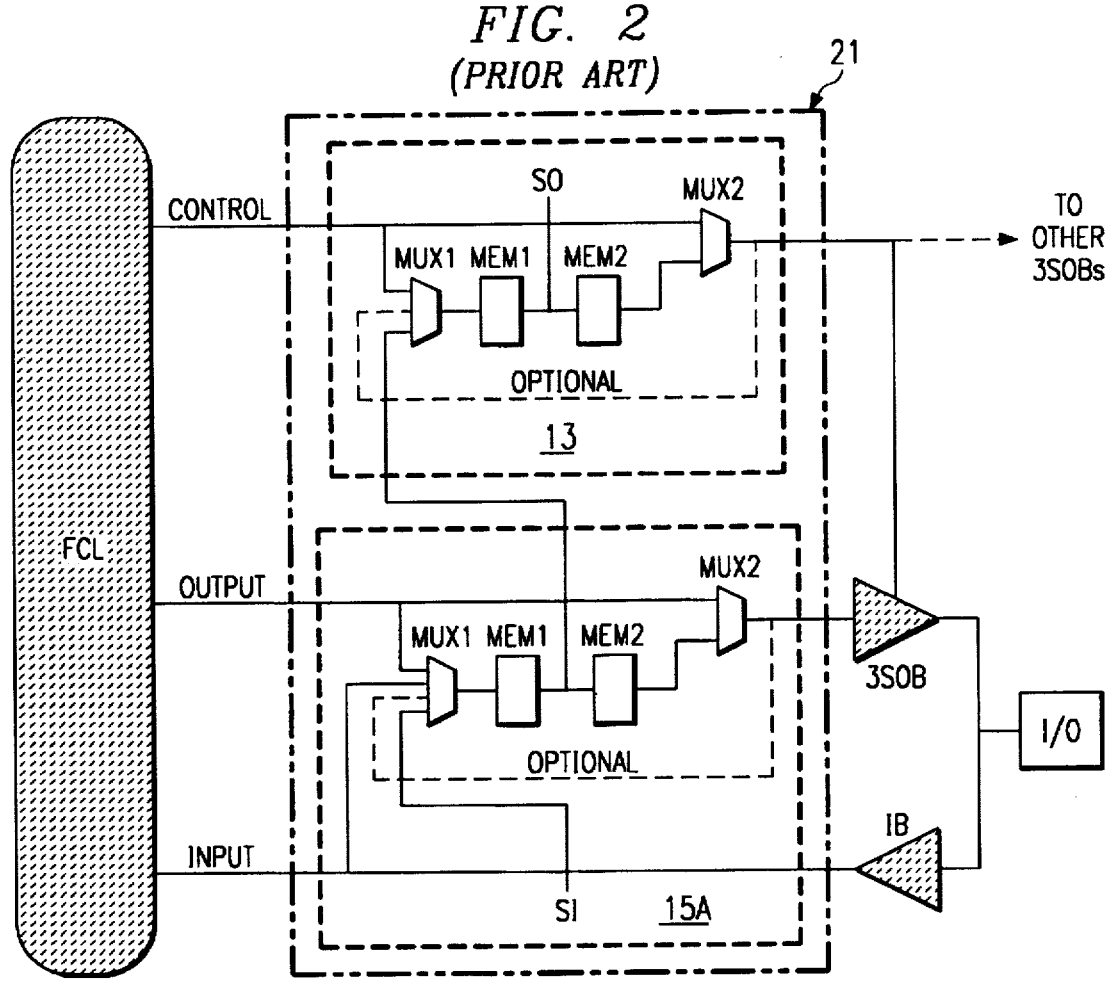

FIGS. 14 and 15 illustrate how the LOB and LOB1 structures described above can be used in combination with a prior art BSC such as BSC 21 of FIG. 2 to provide resolution of voltage contention at the I/O pin. When the desired test data is available at the output of Mux2, then the control signal C momentarily closes switch S1 to update and latch the test data into LOB/LOB1. Switch S1 could also be controlled to perform the periodic update operation described above, even during capture and shift operations of BSC 21.

Figure 16:
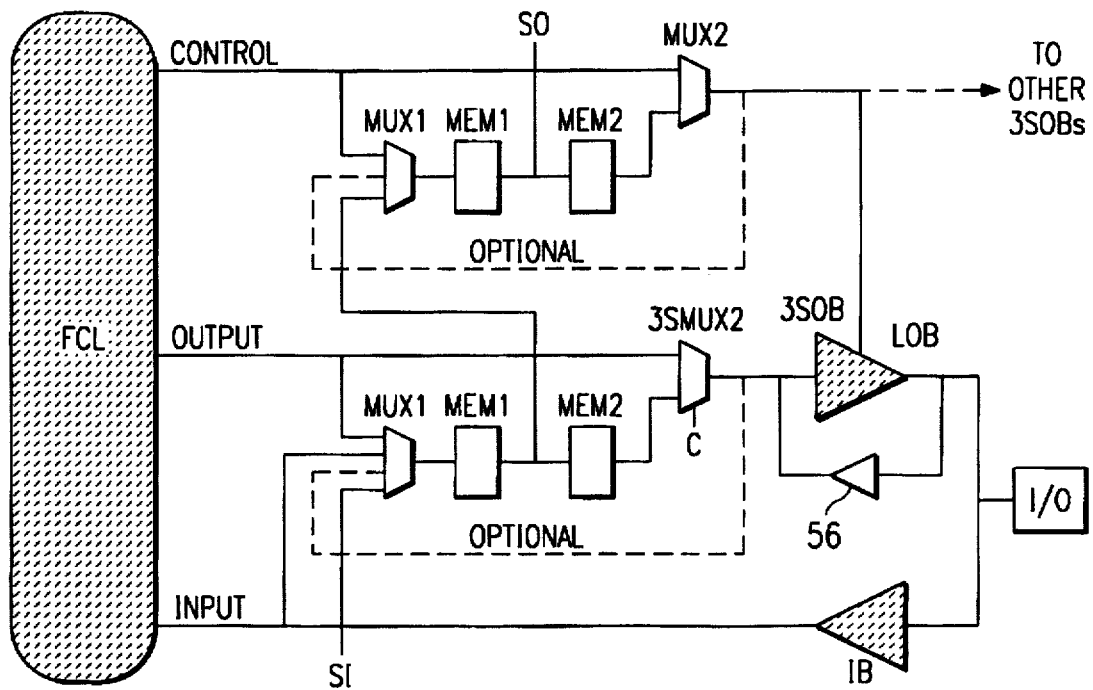
Figure 17:
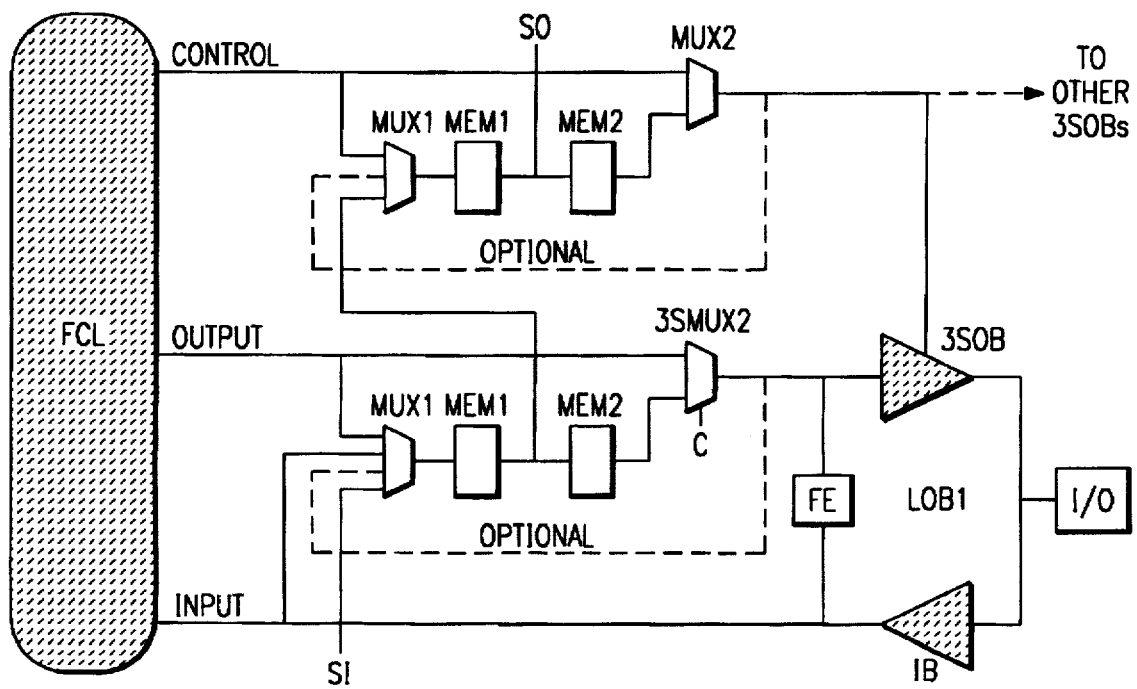

As shown in FIGS. 16 and 17, the function of switch S1 in FIGS. 14 and 15 can be replaced by using a multiplexer 3SMux2 which has a tri-statable output. Instead of opening S1 as in FIGS. 14 and 15, control signal C disables the 3-state output of 3SMux2 in FIGS. 16 and 17, and instead of closing S1 as in FIGS. 14 and 15, control signal C enables the 3-state output of 3SMux2 in FIGS. 16 and 17. The operation of FIGS. 16 and 17 is otherwise the same as FIGS. 14 and 15.

Although exemplary embodiments of the present invention are described above, this description does not limit the scope of the invention, which can be practiced in a variety of embodiments.

What is claimed is:

1. An electrical circuit, comprising:

functional circuitry for performing normal operating functions of the electrical circuit;

a terminal which is accessible externally of said electrical circuit;

an input buffer coupled to said functional circuitry and said externally accessible terminal for driving into said functional circuitry input signals received at said externally accessible terminal;

an output buffer coupled to said functional circuitry and said externally accessible terminal for receiving output signals from said functional circuitry and driving said output signals to said externally accessible terminal;

a test data path for providing test data;

memory circuitry coupled to said test data path for storing test data received from said test data path; and a latching circuit connected to said memory circuitry for receiving and selectively latching test data stored in said memory circuitry, said latching circuit including one of said input buffer and said output buffer.

2. An electrical circuit, comprising:

functional circuitry for performing normal operating functions of the electrical circuit;

a terminal which is accessible externally of said electrical circuit;

an input buffer coupled to said functional circuitry and said externally accessible terminal for driving into said functional circuitry input signals received at said externally accessible terminal;

an output buffer coupled to said functional circuitry and said externally accessible terminal for receiving output signals from said functional circuitry and driving said output signals to said externally accessible terminal;

a test data path for providing test data;

memory circuitry coupled to said test data path for storing test data received from said test data path; and a latching circuit connected to said memory circuitry for receiving and selectively latching test data stored in said memory circuitry, said latching circuit including said input buffer and said output buffer.

3. An electrical circuit, comprising:

functional circuitry for performing normal operating functions of the electrical circuit;

a terminal which is accessible externally of said electrical circuit;

an input buffer coupled to said functional circuitry and said externally accessible terminal for driving into said functional circuitry input signals received at said externally accessible terminal;

an output buffer coupled to said functional circuitry and said externally accessible terminal for receiving output signals from said functional circuitry and driving said output signals to said externally accessible terminal;

a test data path for providing test data;

memory circuitry coupled to said test data path for storing test data received from said test data path; and a latching circuit connected to said memory circuitry for receiving and selectively latching test data stored in said memory circuitry, said latching circuit including said output buffer, and said latching circuit operable to resolve voltage contention at said externally accessible terminal.

4. An electrical circuit, comprising:

Functional circuitry for performing normal operating functions of the electrical circuit;

a terminal which is accessible externally of said electrical circuit;

an input buffer coupled to said functional circuitry and said externally accessible terminal for driving into said functional circuitry input signals received at said externally accessible terminal;

an output buffer coupled to said functional circuitry and said externally accessible terminal for receiving output signals from said functional circuitry and driving said output signals to said externally accessible terminal;

a test data path for providing test data;

first memory circuitry coupled to said test data path for storing test data received from said test data path;

a first latching circuit connected to said first memory circuitry for receiving and selectively latching test data stored in said first memory circuitry, said first latching circuit including said input buffer;

second memory circuitry coupled to said test data path for storing test data received from said test data path; and a second latching circuit connected to said second memory circuitry for receiving and selectively latching test data stored in said second memory circuitry, said second latching circuit including said output buffer.

5. An electrical circuit, comprising:

functional circuitry for performing normal operating functions of the electrical circuit;

a terminal which is accessible externally of said electrical circuit;

an output buffer coupled to said functional circuitry and said externally accessible terminal for receiving output signals from said functional circuitry and driving said output signals to said externally accessible terminal;

an input buffer having an input and an output, said input coupled to said externally accessible terminal for driving to said output signals received at said externally accessible terminal;

a test data path for providing test data;

memory circuitry coupled to said test data path for storing test data received from said test data path; and a latching circuit connected to said memory circuitry for receiving and selectively latching test data stored in said memory circuitry, said latching circuit including said input buffer and said output buffer.

6. The circuit of claim 5, wherein said latching circuit includes a feedback element connected between said output of said input buffer and an input of said output buffer.

7. The circuit of claim 6, wherein said feedback element is a transmission gate.

8. The circuit of claim 6, wherein said feedback element is a 2-state buffer.

9. The circuit of claim 6, wherein said feedback element is a 3-state buffer.

10. The circuit of claim 6, wherein said latching circuit includes a switch connected between said functional circuitry and said input of said output buffer.

11. The circuit of claim 10, wherein said switch is a transmission gate.

12. The circuit of claim 10, wherein said switch is a 3-state buffer.

13. The circuit of claim 2, wherein said latching circuit includes a feedback element connected between an output of said input buffer and an input of said output buffer.

14. The circuit of claim 13, wherein said feedback element is a transmission gate.

15. The circuit of claim 13, wherein said feedback element is a 2-state buffer.

16. The circuit of claim 13, wherein said feedback element is a 3-state buffer.

17. The circuit of claim 13, wherein said latching circuit includes a switch connected between said functional circuitry and said input of said output buffer.

18. The circuit of claim 17, wherein said switch is a transmission gate.

19. The circuit of claim 17, wherein said switch is a 3-state buffer.

* * * * *